(12) United States Patent
Mizutani

(10) Patent No.: US 10,804,210 B2
(45) Date of Patent: Oct. 13, 2020

(54) WIRING BOARD

(71) Applicant: SHINKO ELECTRIC INDUSTRIES CO., LTD., Nagano (JP)

(72) Inventor: Rie Mizutani, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/710,619

(22) Filed: Dec. 11, 2019

(65) Prior Publication Data

US 2020/0211971 A1 Jul. 2, 2020

(30) Foreign Application Priority Data

Dec. 28, 2018 (JP) .................. 2018-248298

(51) Int. Cl.
*H01L 23/538* (2006.01)
*H01L 21/48* (2006.01)
*H01L 25/18* (2006.01)
*H05K 1/02* (2006.01)

(52) U.S. Cl.
CPC ........ *H01L 23/5386* (2013.01); *H01L 21/481* (2013.01); *H01L 21/4846* (2013.01); *H01L 25/18* (2013.01); *H05K 1/0227* (2013.01); *H05K 2201/093* (2013.01)

(58) Field of Classification Search
CPC ... H05K 2201/09036; H05K 2201/093; H05K 2201/0949; H05K 2201/09409; H05K 2201/09063; H05K 2201/09718; H05K 2201/0969; H05K 2201/09681; H05K 1/116; H05K 1/0219–0227; H05K 2203/1178; H01L 23/5389; H01L 21/4846; H01L 21/481
See application file for complete search history.

(56) References Cited

U.S. PATENT DOCUMENTS

| | | | | |
|---|---|---|---|---|
| 3,293,353 A | * | 12/1966 | Hendriks | H05K 9/0039 174/36 |
| 4,061,263 A | * | 12/1977 | Ohlstein | B23K 1/0016 228/124.1 |
| 6,106,923 A | * | 8/2000 | Takahashi | H01L 23/5383 174/254 |
| 6,124,553 A | * | 9/2000 | Narizuka | H01L 23/49822 174/260 |
| 7,659,790 B2 | * | 2/2010 | Shaul | H01P 3/003 333/1 |
| 9,711,439 B2 | | 7/2017 | Sakamoto et al. | |
| 2003/0127249 A1 | * | 7/2003 | Budell | H05K 1/0224 174/261 |
| 2003/0146020 A1 | * | 8/2003 | Brist | H05K 1/0206 174/262 |

(Continued)

FOREIGN PATENT DOCUMENTS

JP 2016-051834 4/2016

*Primary Examiner* — Roshn K Varghese
(74) *Attorney, Agent, or Firm* — IPUSA, PLLC

(57) ABSTRACT

A wiring board includes an insulating layer, and a metal layer, formed on the insulating layer, and including a first pattern that includes a plurality of wirings extending parallel to each other, and a second pattern that includes a degassing hole. The insulating layer includes a groove exposed between the plurality of wirings, and a surface of the insulating layer inside the degassing hole is located above a bottom surface of the groove.

15 Claims, 30 Drawing Sheets

(56) References Cited

U.S. PATENT DOCUMENTS

| | | | | |
|---|---|---|---|---|
| 2003/0213616 A1* | 11/2003 | Kusukawa | ........ | H01L 23/49822 174/257 |
| 2008/0173469 A1* | 7/2008 | Hirakawa | ............ | H05K 1/0219 174/255 |
| 2013/0256000 A1* | 10/2013 | Terui | .................... | H05K 1/0298 174/251 |
| 2016/0020163 A1* | 1/2016 | Shimizu | ............ | H01L 23/49822 361/768 |
| 2016/0066423 A1* | 3/2016 | Sakamoto | ................ | H05K 1/02 174/261 |

\* cited by examiner

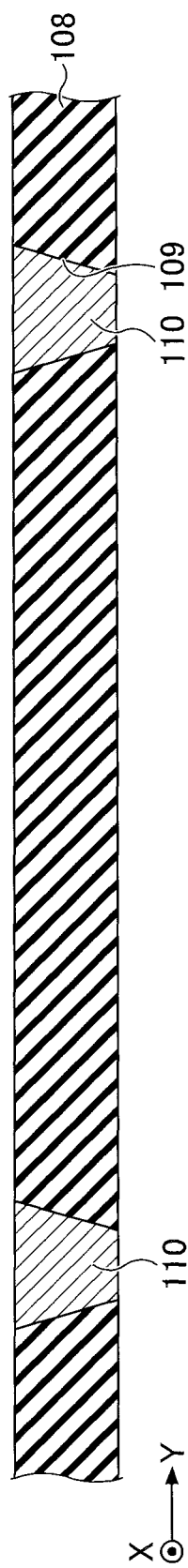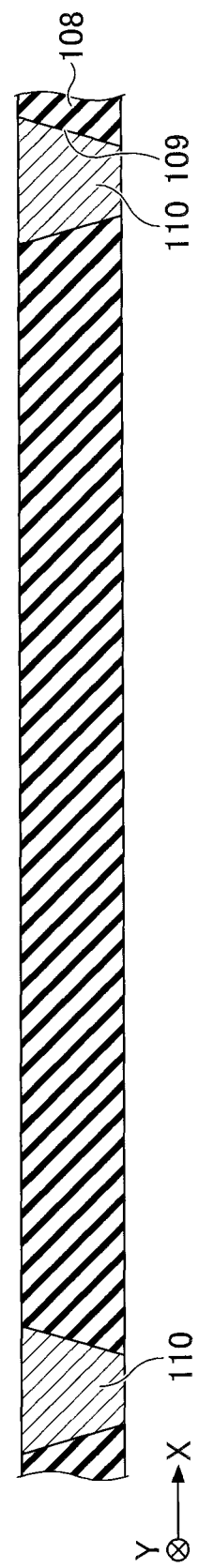

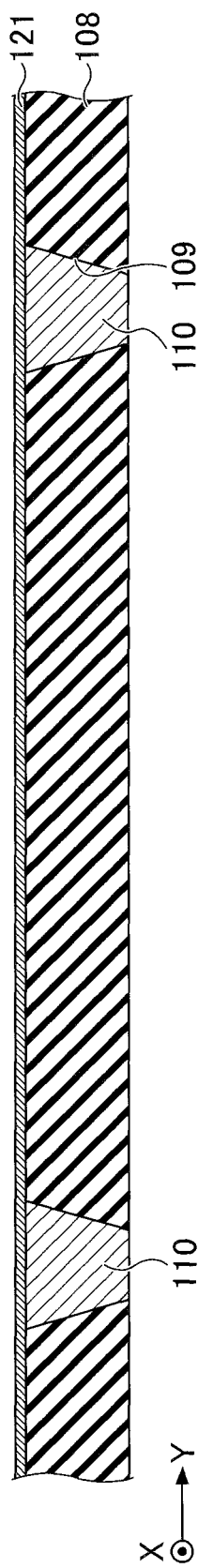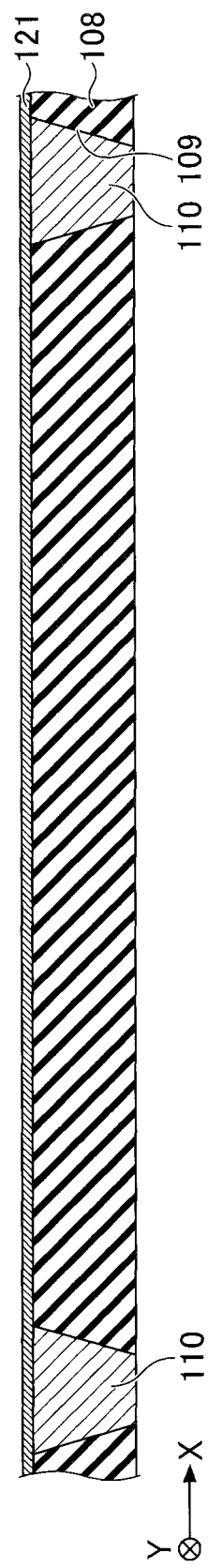

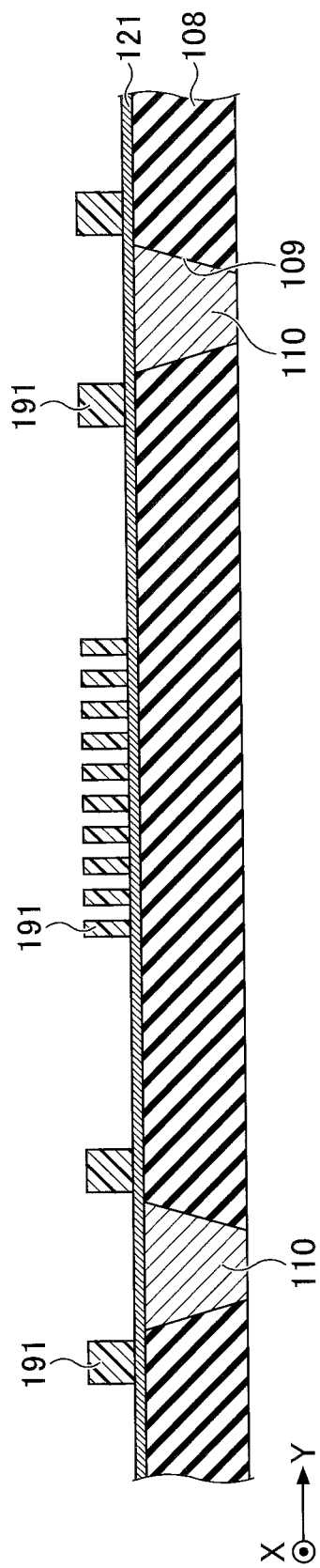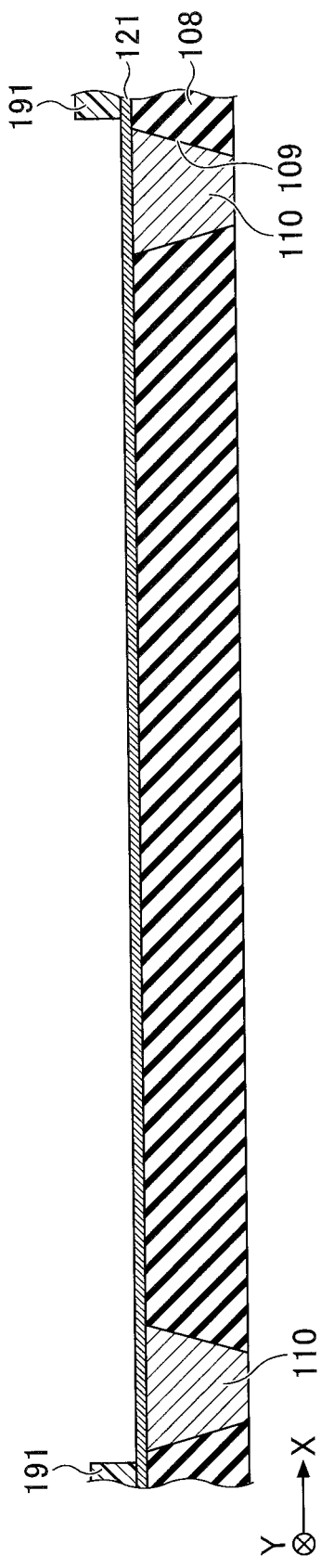

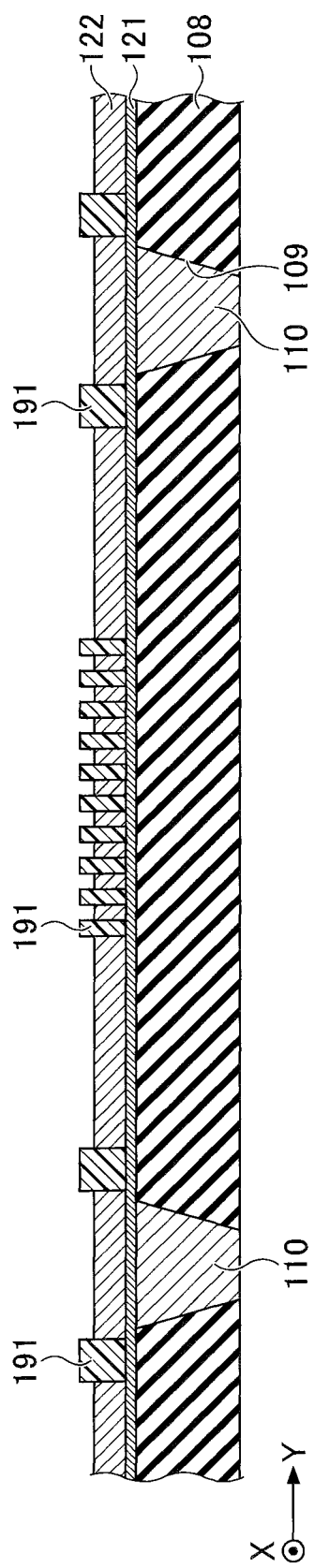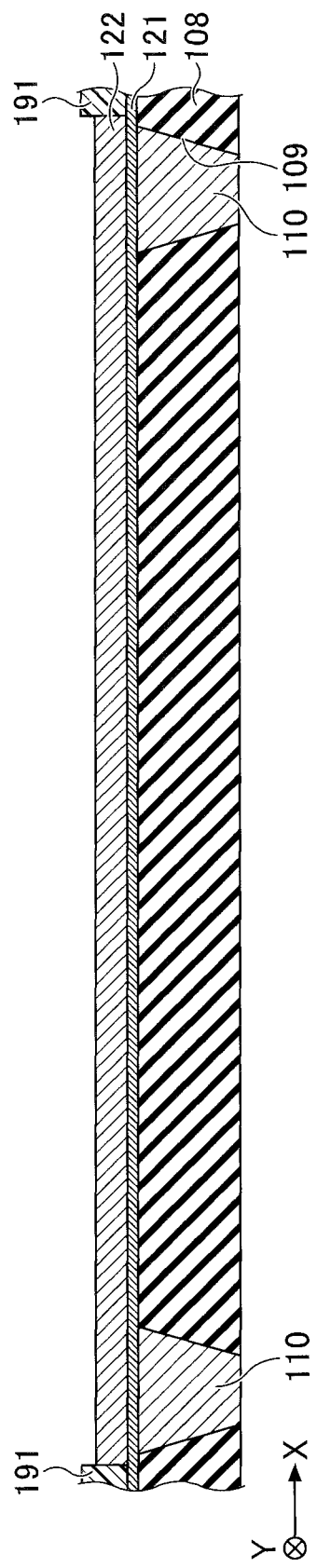

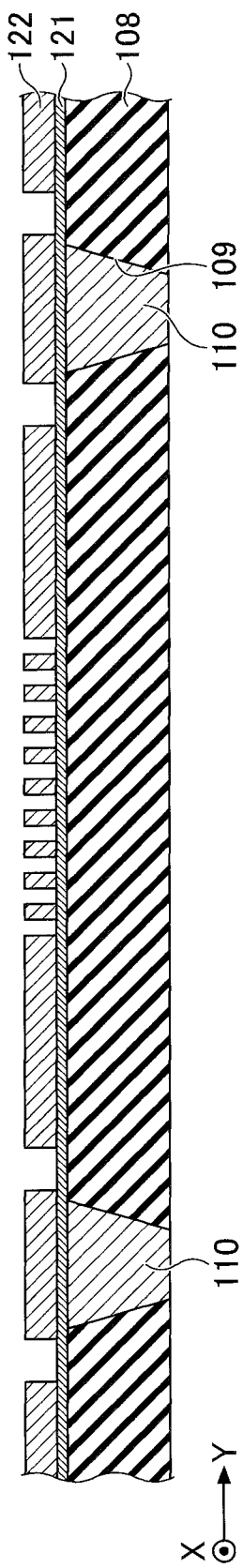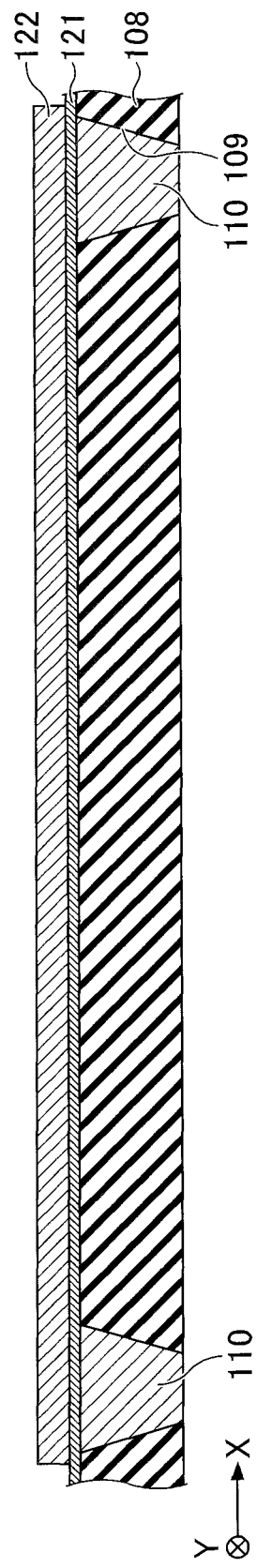

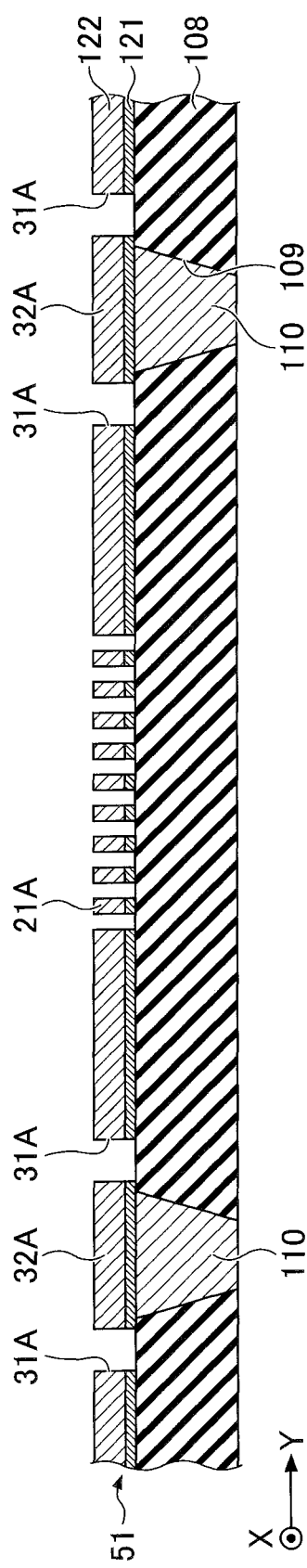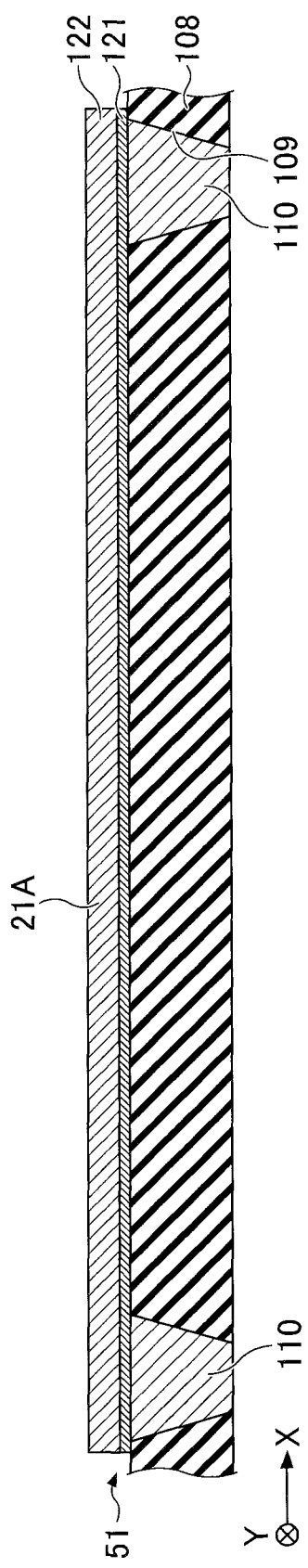

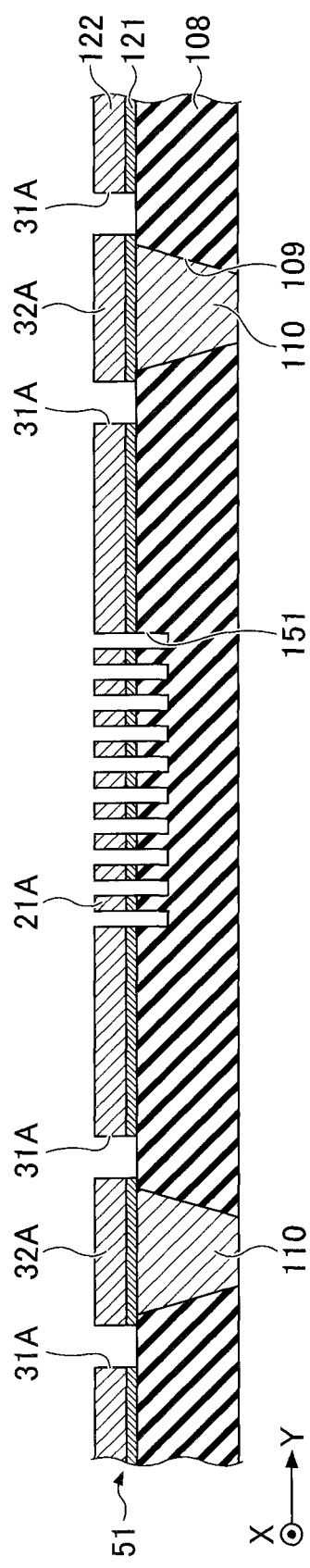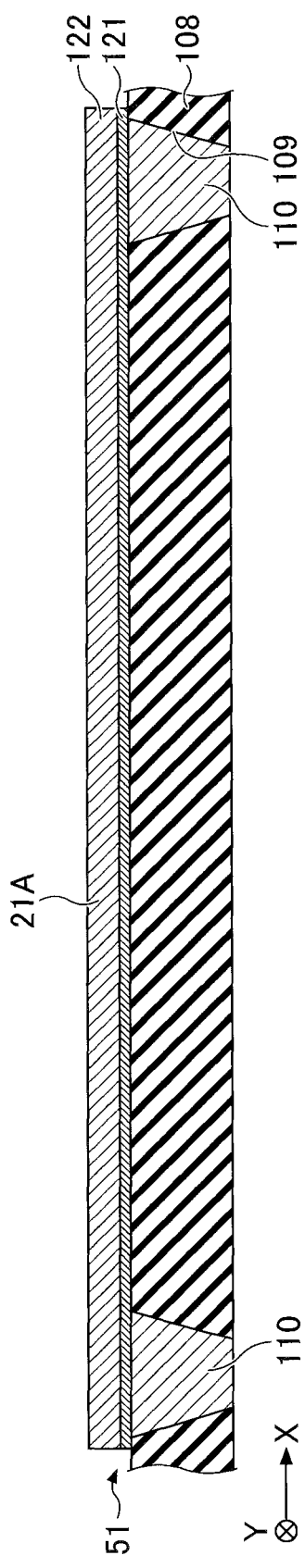

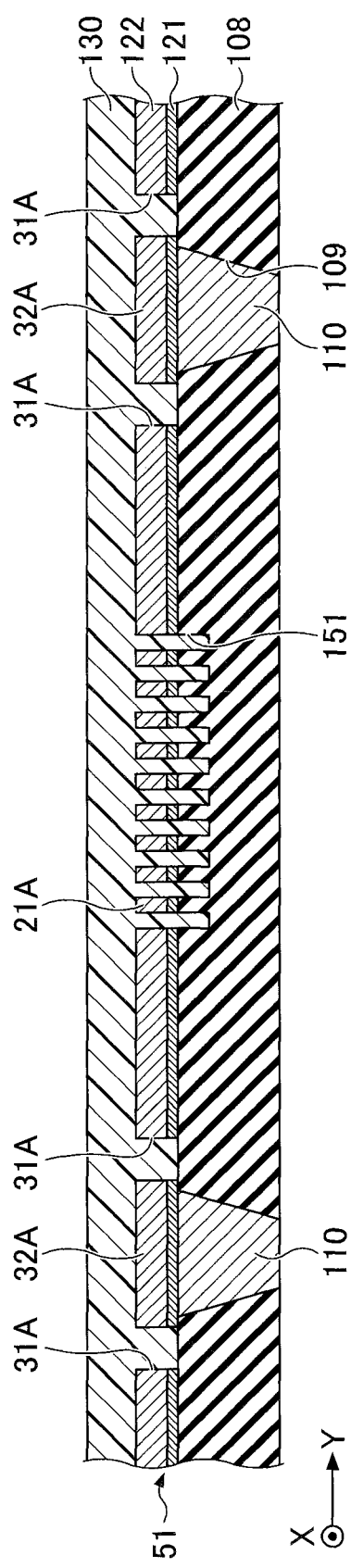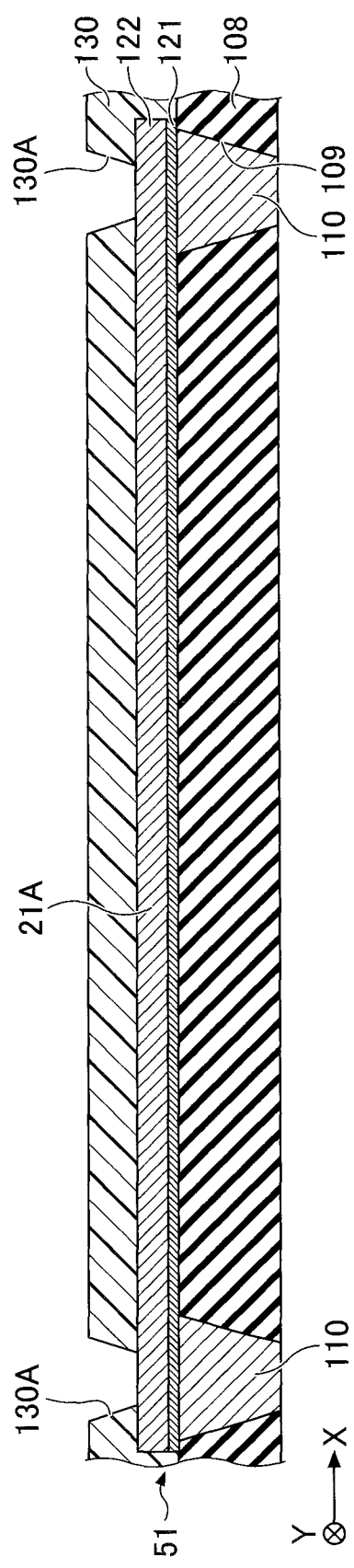

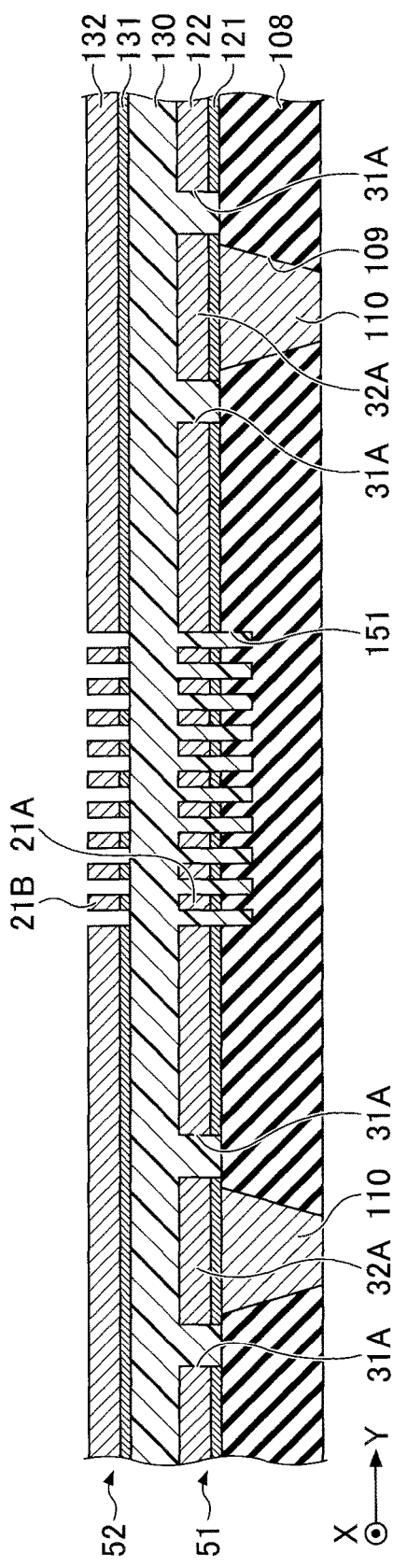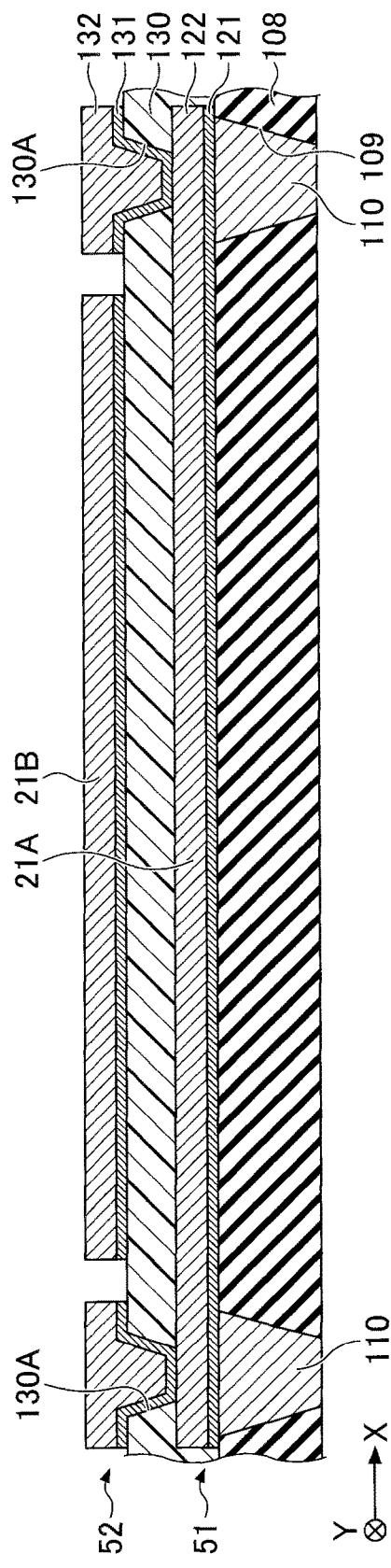

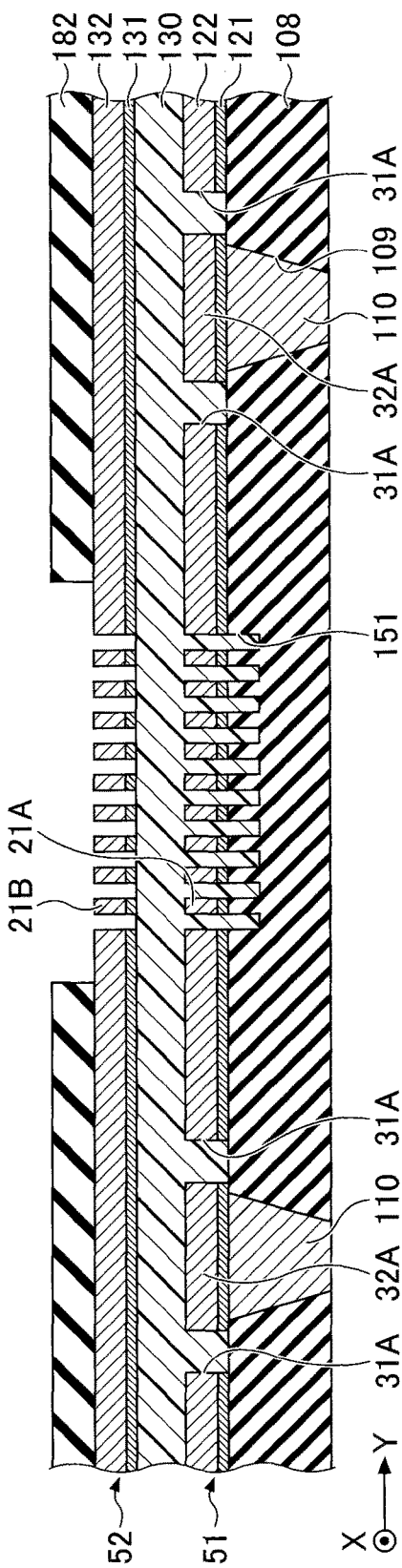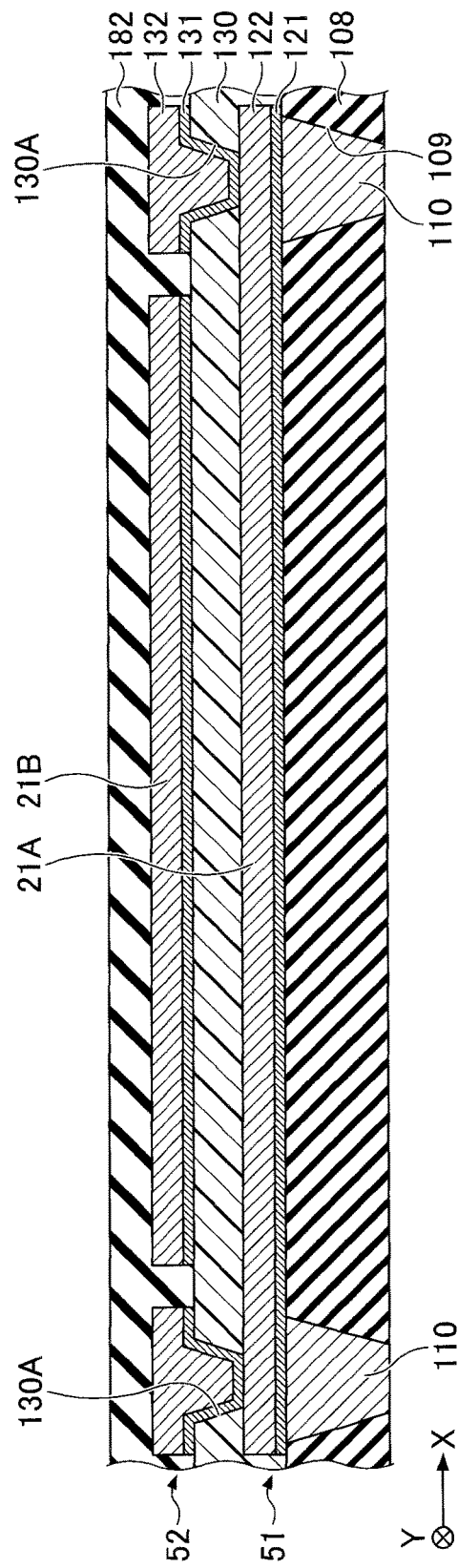

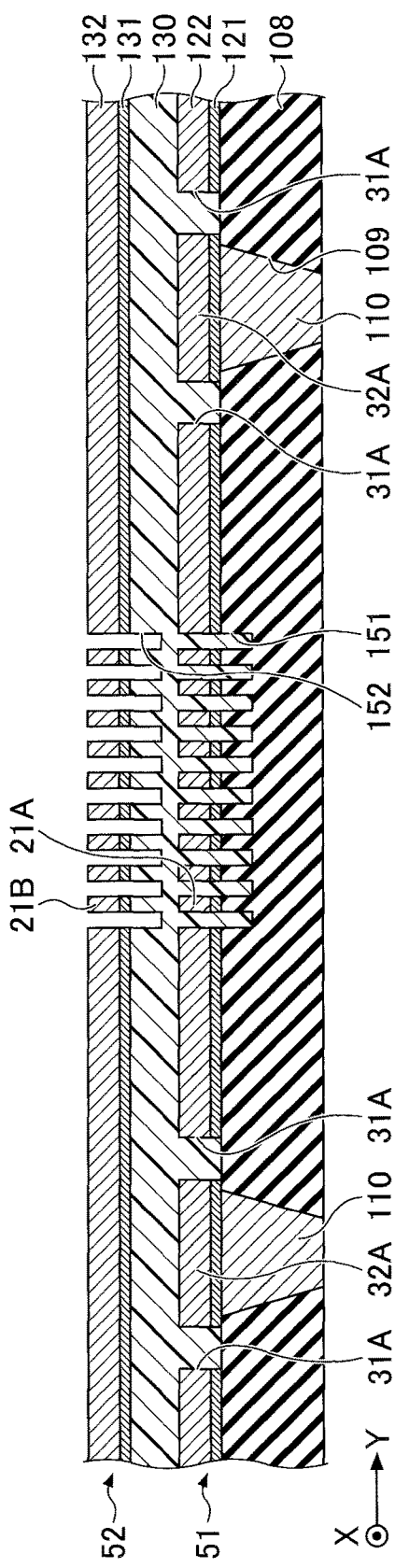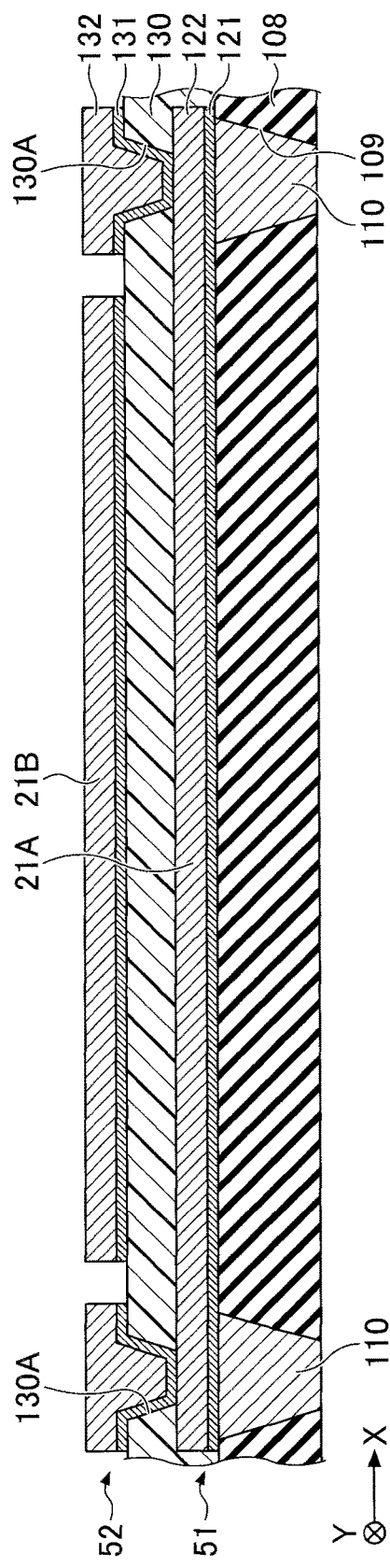

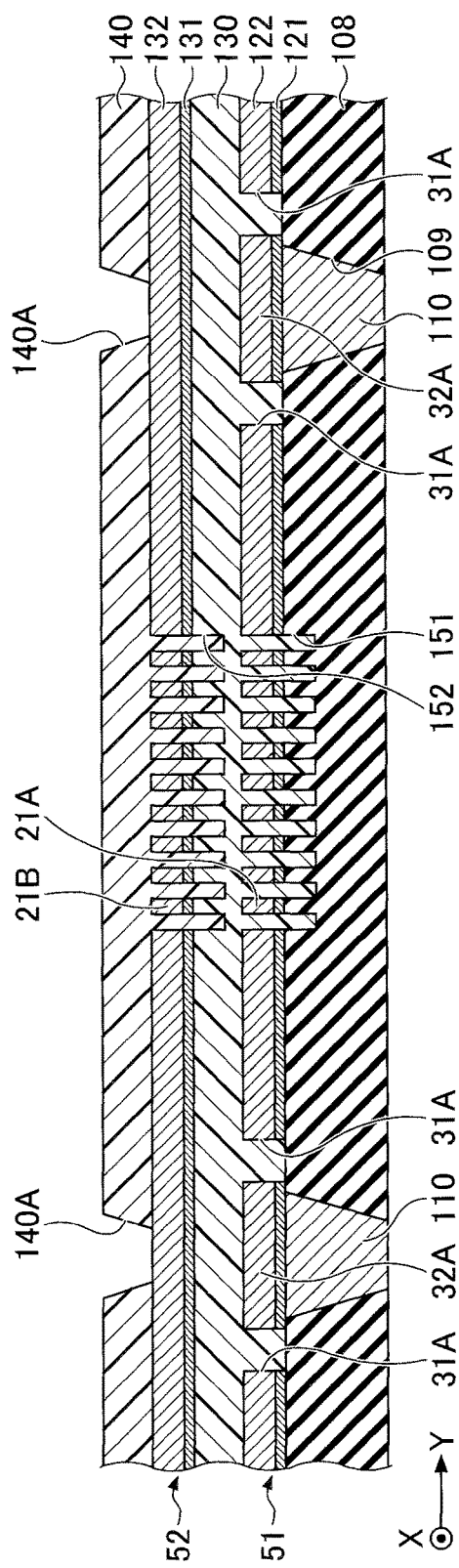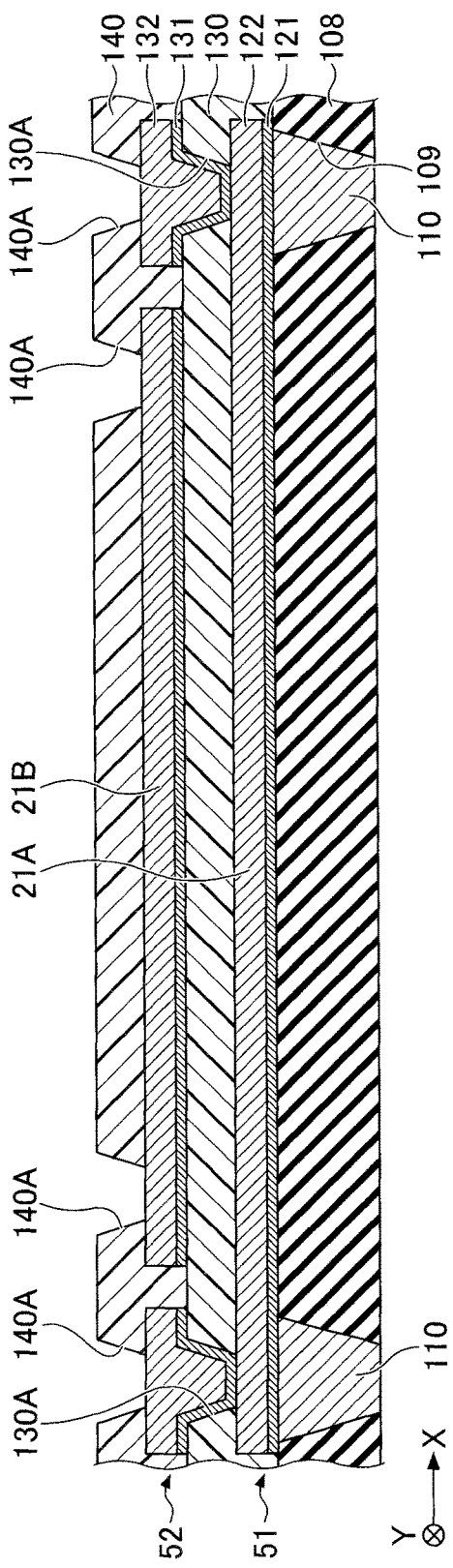

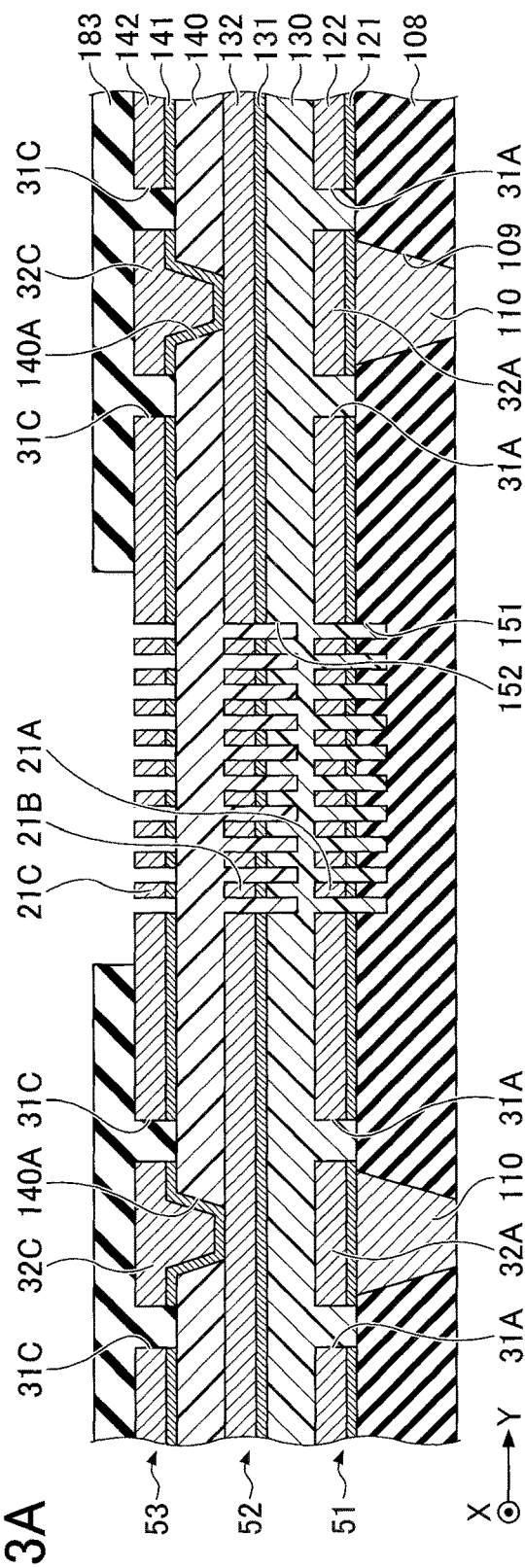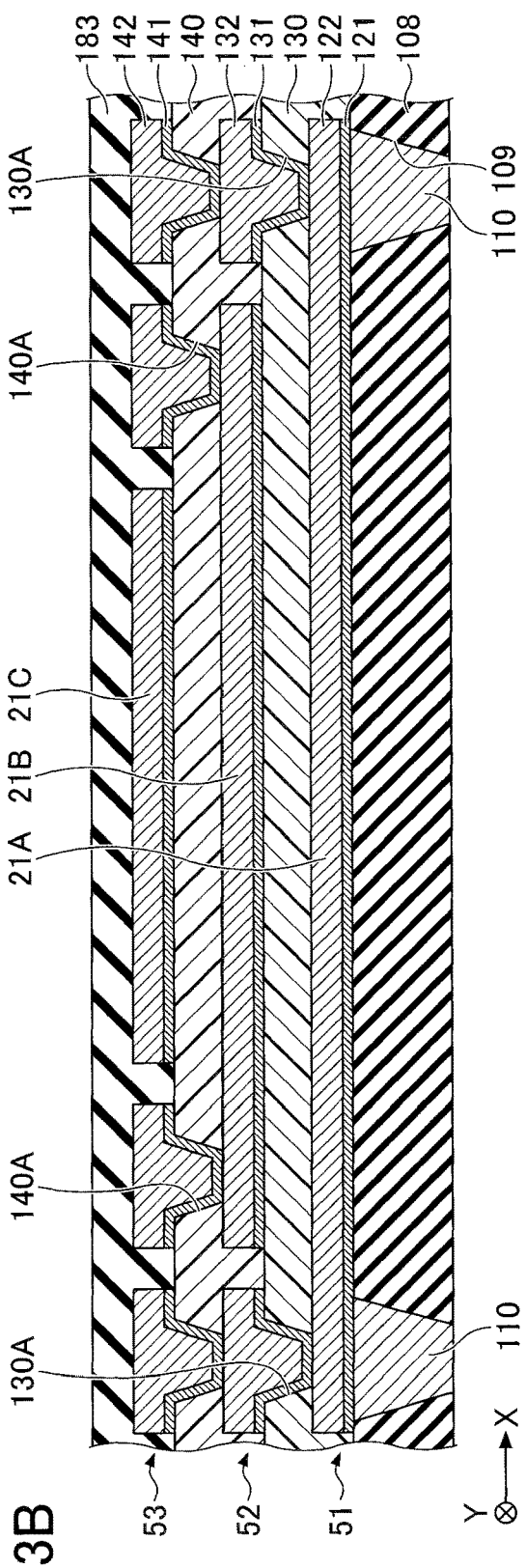

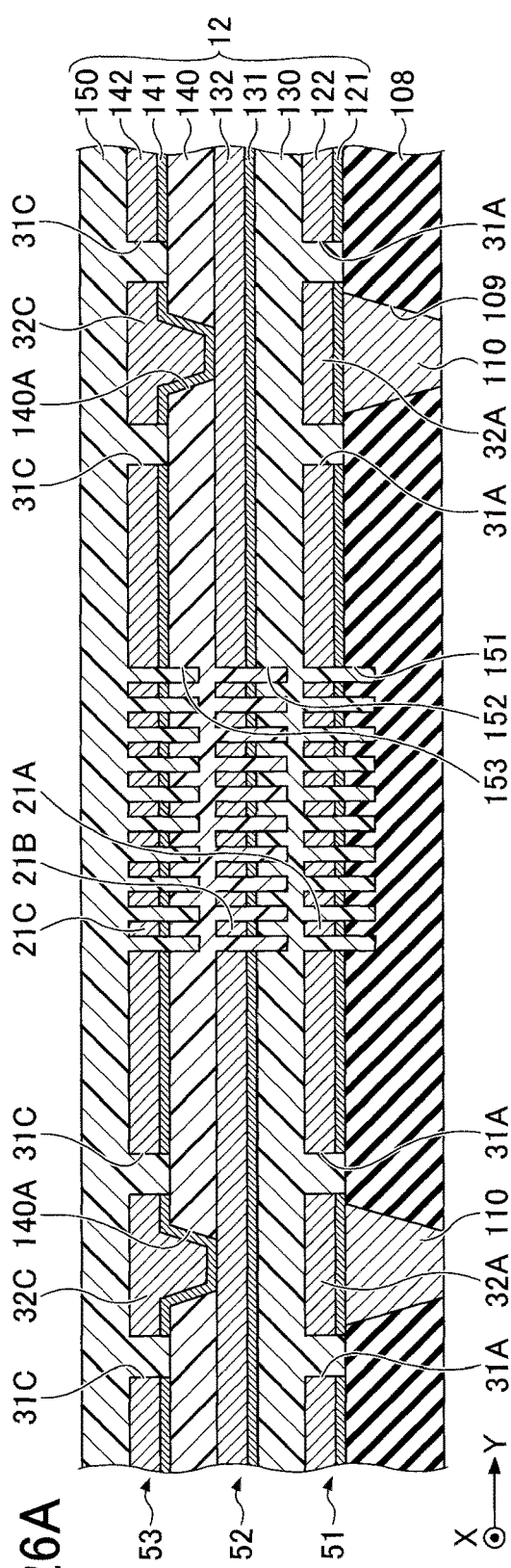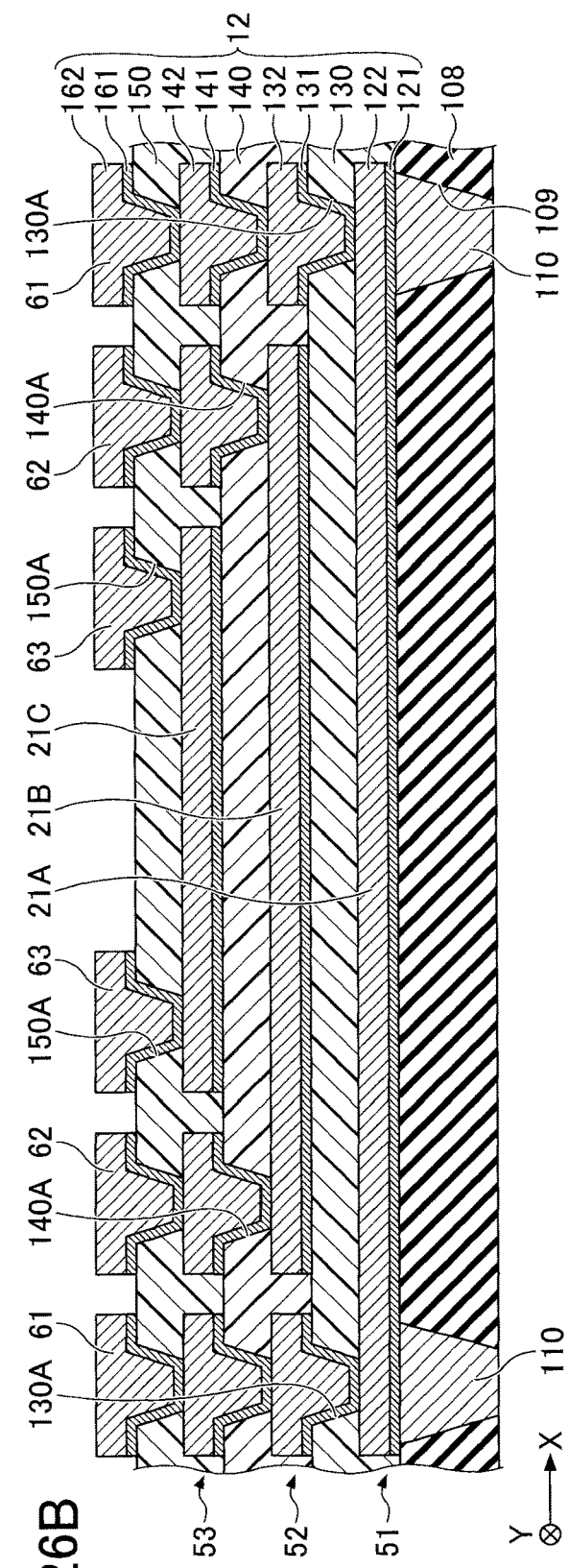

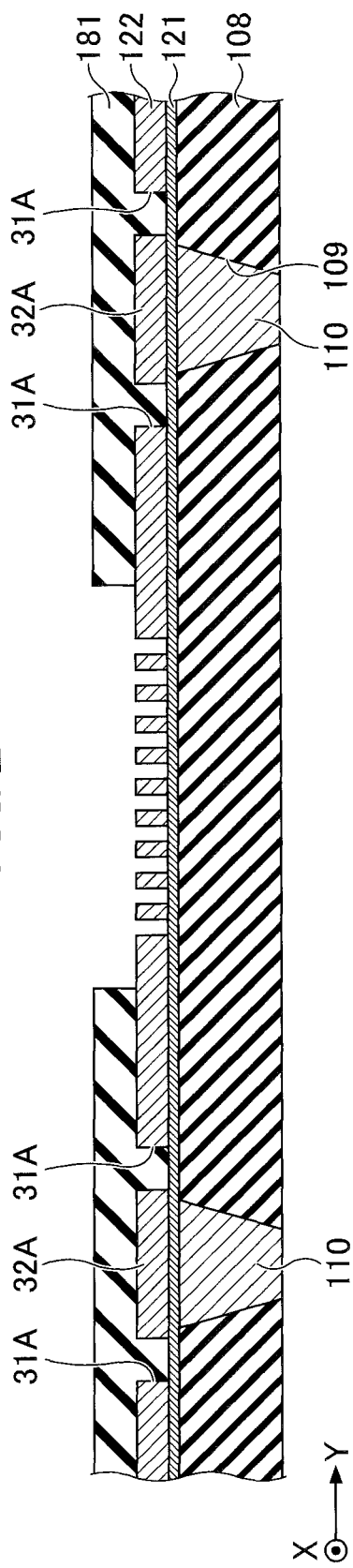
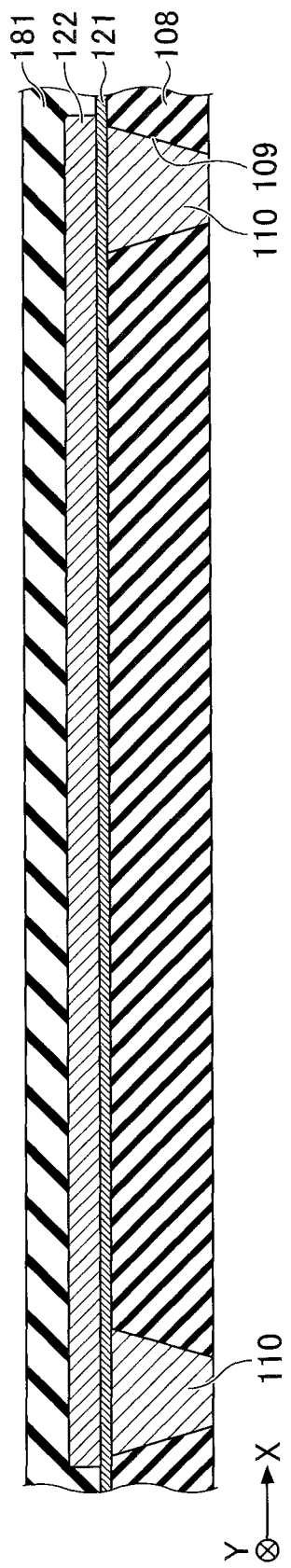
FIG.27A
FIG.27B

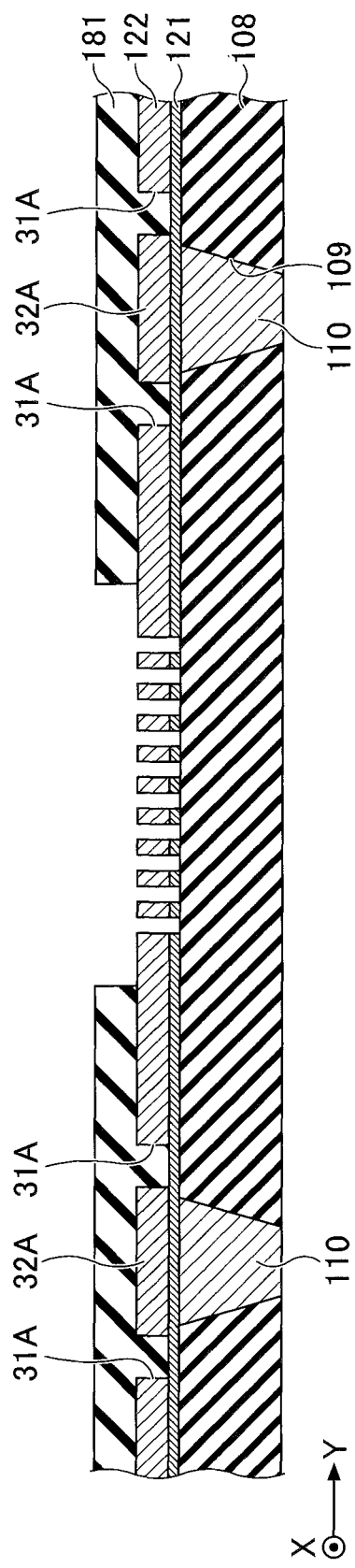
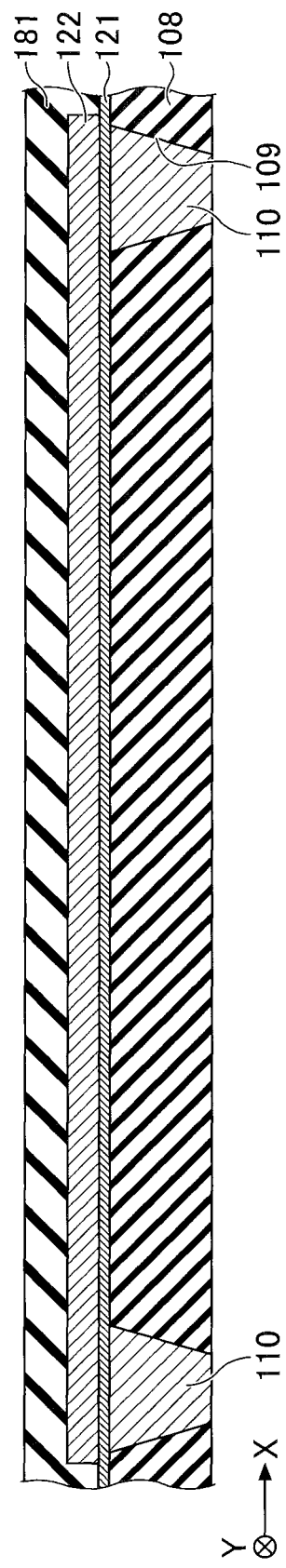
FIG.28A
FIG.28B

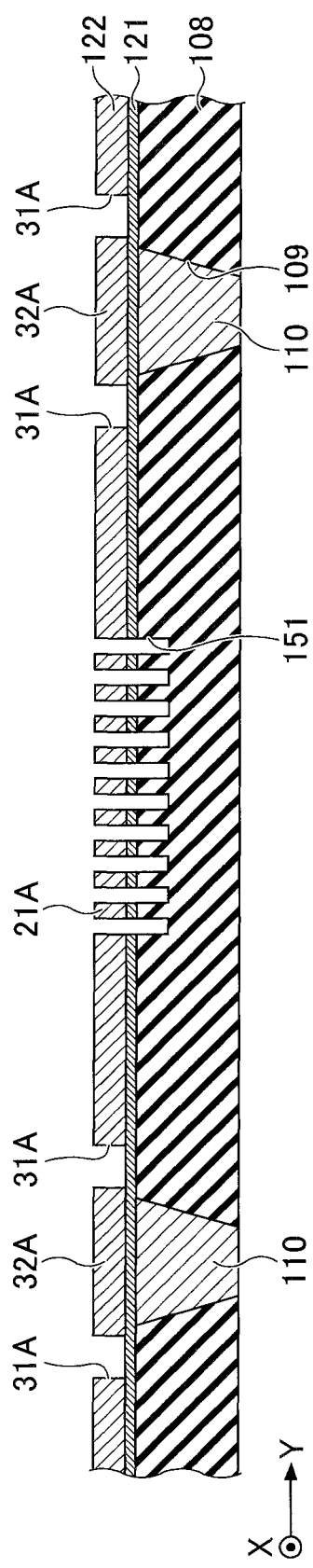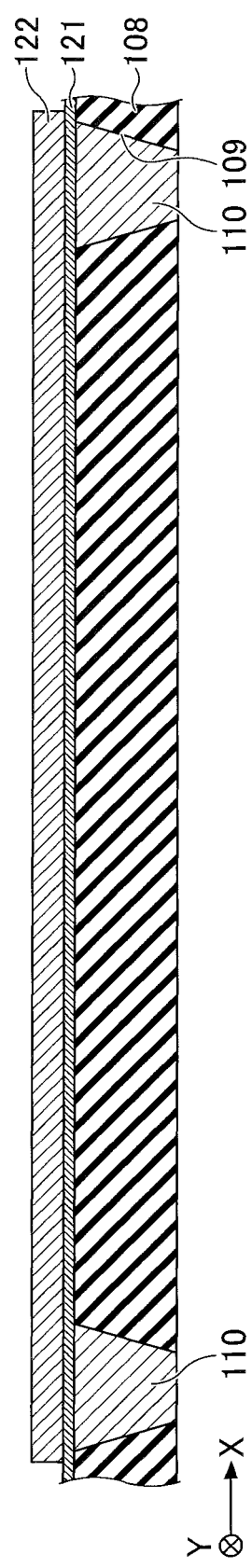

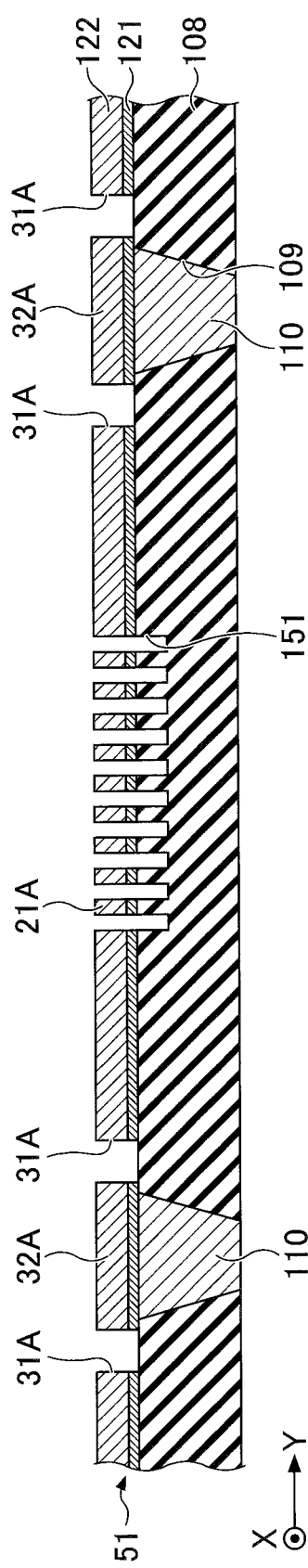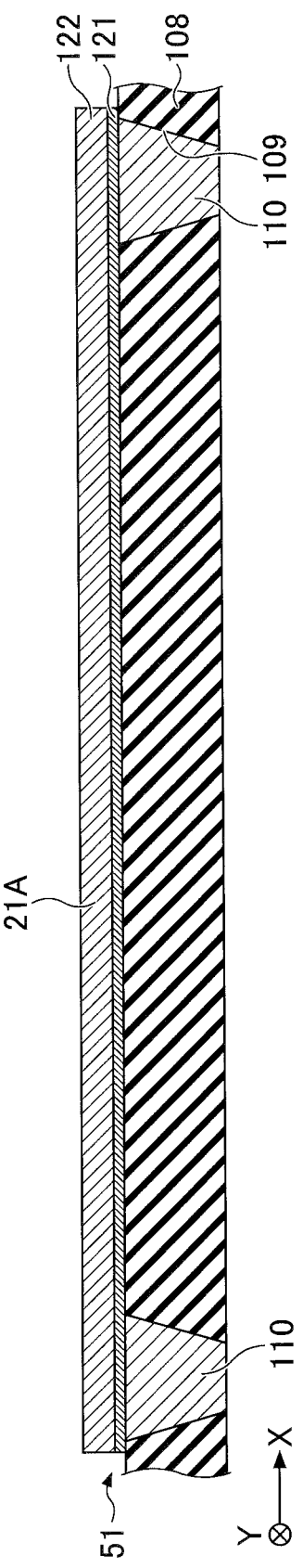

WIRING BOARD

CROSS-REFERENCE TO RELATED APPLICATION

This application is based upon and claims priority to Japanese Patent Application No. 2018-248298, filed on Dec. 28, 2018, the entire contents of which are incorporated herein by reference.

FIELD

Certain aspects of the embodiments discussed herein are related to a wiring board, and a method of manufacturing the wiring board.

BACKGROUND

A wiring board including a cavity formed between adjacent conductor patterns, to reduce ion migration between the adjacent conductor patterns, is described in Japanese Laid-Open Patent Publication No. 2016-051834, for example.

However, in the wiring board including the cavity formed between the adjacent conductor patterns, a connection failure may occur due to the cavity.

SUMMARY

Accordingly, it is an object in one aspect of the embodiments to provide a wiring board and a method of manufacturing the wiring board, which can reduce the connection failure.

According to one aspect of the embodiments, a wiring board includes an insulating layer; and a metal layer, formed on the insulating layer, and including a first pattern that includes a plurality of wirings extending parallel to each other, and a second pattern that includes a degassing hole, wherein the insulating layer includes a groove exposed between the plurality of wirings, and wherein a surface of the insulating layer inside the degassing hole is located above a bottom surface of the groove.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 9A and FIG. 9B are cross sectional views for explaining the method of manufacturing the wiring board according to the second embodiment;

FIG. 10A and FIG. 10B are cross sectional views for explaining the method of manufacturing the wiring board according to the second embodiment;

FIG. 11A and FIG. 11B are cross sectional views for explaining the method of manufacturing the wiring board according to the second embodiment;

FIG. 12A and FIG. 12B are cross sectional views for explaining the method of manufacturing the wiring board according to the second embodiment;

FIG. 13A and FIG. 13B are cross sectional views for explaining the method of manufacturing the wiring board according to the second embodiment;

FIG. 14A and FIG. 14B are cross sectional views for explaining the method of manufacturing the wiring board according to the second embodiment;

FIG. 16A and FIG. 16B are cross sectional views for explaining the method of manufacturing the wiring board according to the second embodiment;

FIG. 17A and FIG. 17B are cross sectional views for explaining the method of manufacturing the wiring board according to the second embodiment;

FIG. 18A and FIG. 18B are cross sectional views for explaining the method of manufacturing the wiring board according to the second embodiment;

FIG. 19A and FIG. 19B are cross sectional views for explaining the method of manufacturing the wiring board according to the second embodiment;

FIG. 20A and FIG. 20B are cross sectional views for explaining the method of manufacturing the wiring board according to the second embodiment;

FIG. 21A and FIG. 21B are cross sectional views for explaining the method of manufacturing the wiring board according to the second embodiment;

FIG. 23A and FIG. 23B are cross sectional views for explaining the method of manufacturing the wiring board according to the second embodiment;

FIG. 26A and FIG. 26B are cross sectional views for explaining the method of manufacturing the wiring board according to the second embodiment;

FIG. 27A and FIG. 27B are cross sectional views for explaining the method of manufacturing the wiring board according to a third embodiment;

FIG. 28A and FIG. 28B are cross sectional views for explaining the method of manufacturing the wiring board according to the third embodiment;

FIG. 29A and FIG. 29B are cross sectional views for explaining the method of manufacturing the wiring board according to the third embodiment; and FIG. 30A and FIG. 30B are cross sectional views for explaining the method of manufacturing the wiring board according to the third embodiment.

DESCRIPTION OF EMBODIMENTS

Figure 1:
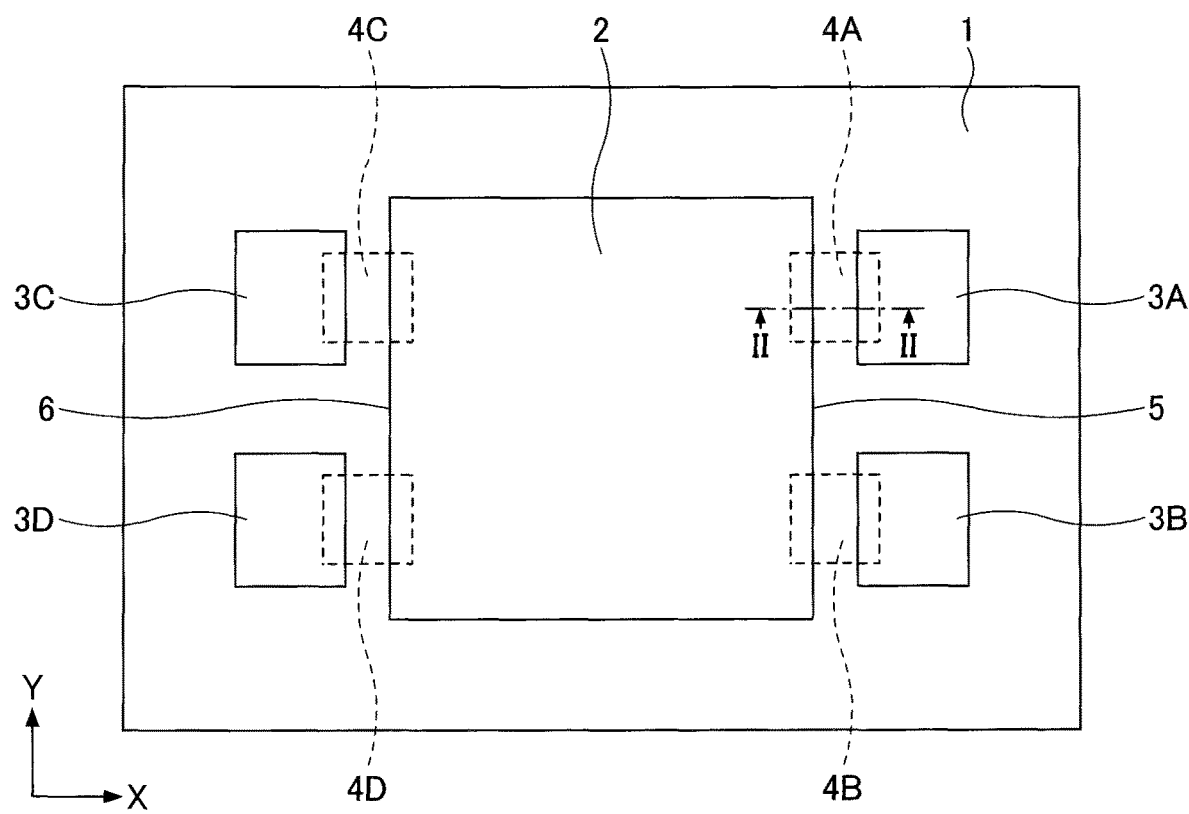
FIG. 1 is a diagram illustrating a layout of a wiring board according to a first embodiment.

The present inventor diligently studied to investigate the cause of the connection failure. As a result, the present inventor found that a void exists near a degassing hole that is provided in a periphery of a conductor pattern, and that peeling (or separation) of a layer is caused by this void. In addition, while the cause of the void that is generated is a micro-groove formed between the conductor patterns, the present inventor found that a groove is also formed inside the degassing hole, at the same time as the micro-groove, and that an insulating layer is not appropriately formed inside this groove.

Preferred embodiments of the present invention will be described with reference to the accompanying drawings. In the drawings, those parts that are the same are designated by the same reference numerals, and a repeated description of the same parts may be omitted.

A description will now be given of a wiring board and a method of manufacturing the wiring board in each embodiment according to the present invention.

First Embodiment

Figure 2:
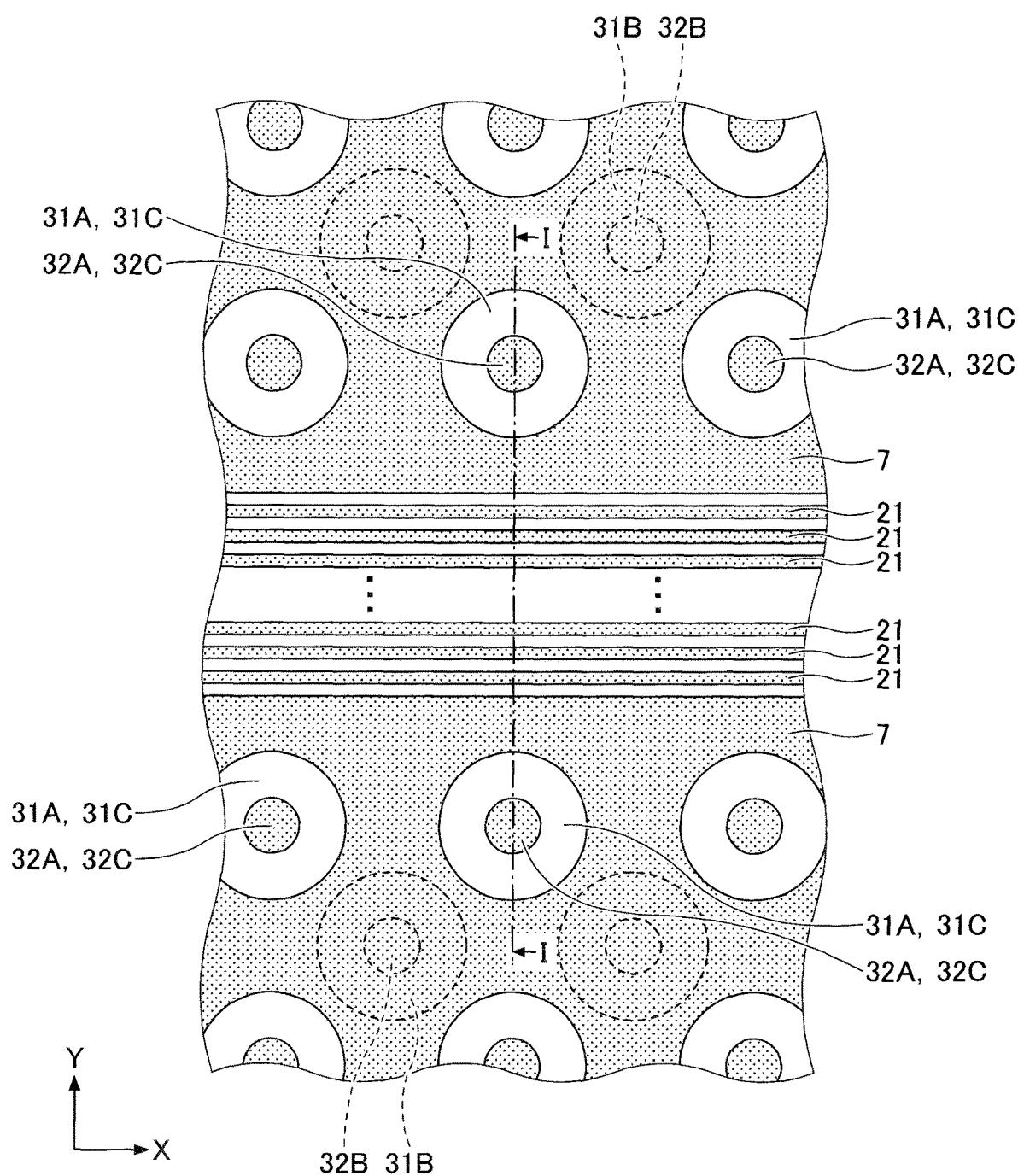
FIG. 2 is a diagram, on an enlarged scale, illustrating a micro-wiring region and a vicinity thereof in FIG. 1.

A first embodiment will be described. This first embodiment relates to the wiring board. FIG. 1 is a diagram illustrating a layout of the wiring board according to the first embodiment. FIG. 2 is a diagram, on an enlarged scale, illustrating a micro-wiring region and a vicinity thereof in FIG. 1.

As illustrated in FIG. 1, a wiring board 1 according to the first embodiment includes a first region 2 where a semiconductor integrated circuit chip, such as an Application Specific Integrated Circuit (ASIC) or the like, is mounted, and second regions 3A, 3B, 3C, and 3D where a semiconductor memory chip, such as a High Bandwidth Memory (HBM) or the like, is mounted. The first region 2 has a rectangular planar shape. The second regions 3A and 3B are arranged side by side along one side 5 of the first region 2, and the second regions 3C and 3D are arranged side by side along another side 6 of the first region 2, parallel to the side 5. In the following description, a direction in which the side 5 and the side 6 extend will be referred to as a Y-direction, and a direction perpendicular to the Y-direction on a plane parallel to a principal plane of the wiring board 1 will be referred to as a X-direction.

A micro-wiring region 4A is provided between the first region 2 and the second region 3A. The micro-wiring region 4A includes a plurality of micro-wirings electrically connecting the semiconductor integrated circuit chip that is mounted in the first region 2, and the semiconductor memory chip that is mounted in the second region 3A. A micro-wiring region 4B is provided between the first region 2 and the second region 3B. The micro-wiring region 4B includes a plurality of micro-wirings electrically connecting the semiconductor integrated circuit chip that is mounted in the first region 2, and the semiconductor memory chip that is mounted in the second region 3B. A micro-wiring region 4C is provided between the first region 2 and the second region 3C. The micro-wiring region 4C includes a plurality of micro-wirings electrically connecting the semiconductor integrated circuit chip that is mounted in the first region 2, and the semiconductor memory chip that is mounted in the second region 3C. A micro-wiring region 4D is provided between the first region 2 and the second region 3D. The micro-wiring region 4D includes a plurality of micro-wirings electrically connecting the semiconductor integrated circuit chip that is mounted in the first region 2, and the semiconductor memory chip that is mounted in the second region 3D.

FIG. 2 illustrates, as an example, the micro-wiring region 4A and a vicinity thereof, among the micro-wiring regions 4A through 4D. As illustrated in FIG. 2, the micro-wiring region 4A includes a plurality of micro-wirings 21 extending in the X-direction. The plurality of micro-wirings 21 are formed by a Line-and-Space (L/S) pattern in which a line width and a space width respectively are 1 μm to 5 μm, for example.

Ground regions 7 are provided in vicinities of the first region 2, the second regions 3A through 3D, and the micro-wiring regions 4A through 4D. A plurality of metal layers that are grounded, are provided in the ground region 17. In this example, 3 metal layers are provided in the ground region 17. A plurality of degassing holes 31A are formed in a first metal layer, a plurality of degassing holes 31B are faulted in a second metal layer, and a plurality of degassing holes 31C are formed in a third metal layer. An anchor via pad 32A is provided at a central part of the degassing hole 31A, an anchor via pad 32B is provided at a central part of the degassing hole 31B, and an anchor via pad 32C is provided at a central part of the degassing hole 31C. In a plan view, the degassing hole 31A and the degassing hole 31C overlap, and the anchor via pad 32A and the anchor via pad 32C overlap. In the plan view, the degassing hole 31B is separated from the degassing holes 31A and 31C, and the anchor via pad 32B is separated from the anchor via pads 32A and 32C. For example, the degassing holes 31A through 31C have a diameter of 50 μm to 150 μm, and the anchor via pads 32A through 32C have a diameter of 20 μm to 40 μm.

Figure 3:
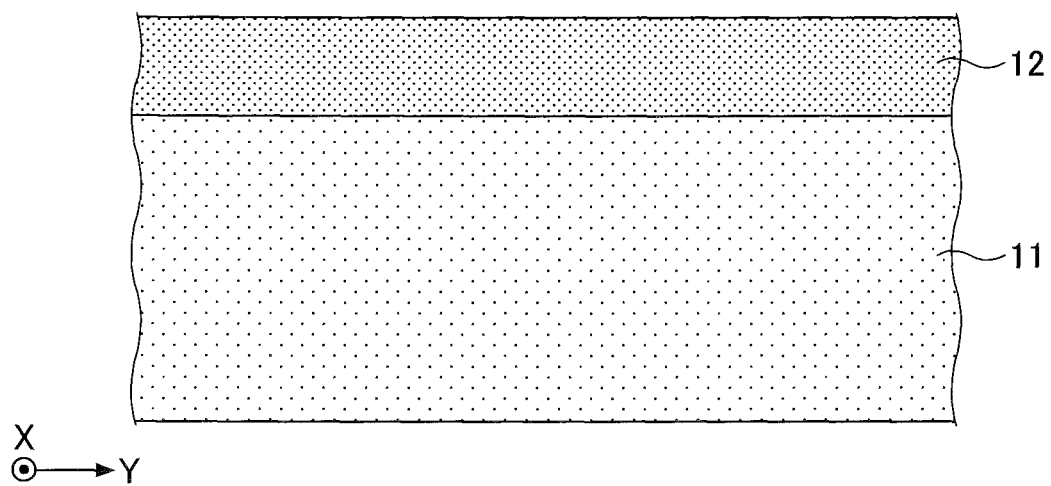
FIG. 3 is a cross sectional diagram schematically illustrating the wiring board according to the first embodiment.
Figure 4:
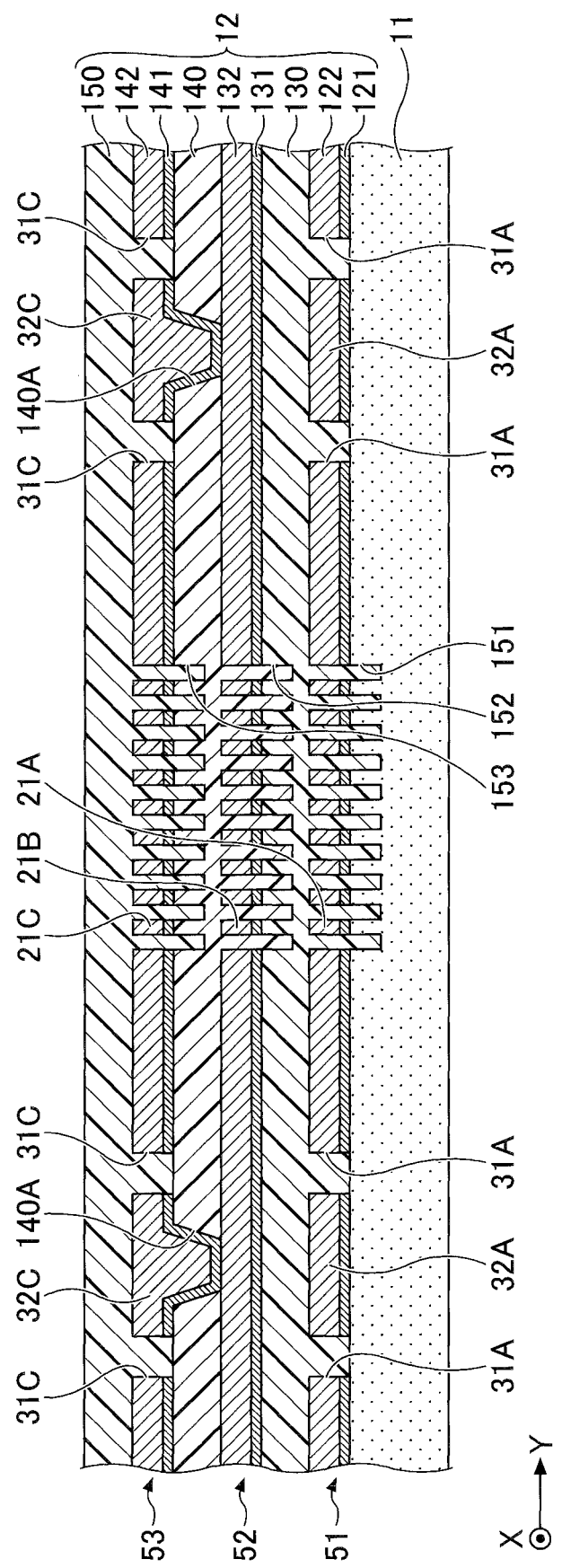
FIG. 4 is a cross sectional view illustrating details of a thin-film layer.
Figure 5:
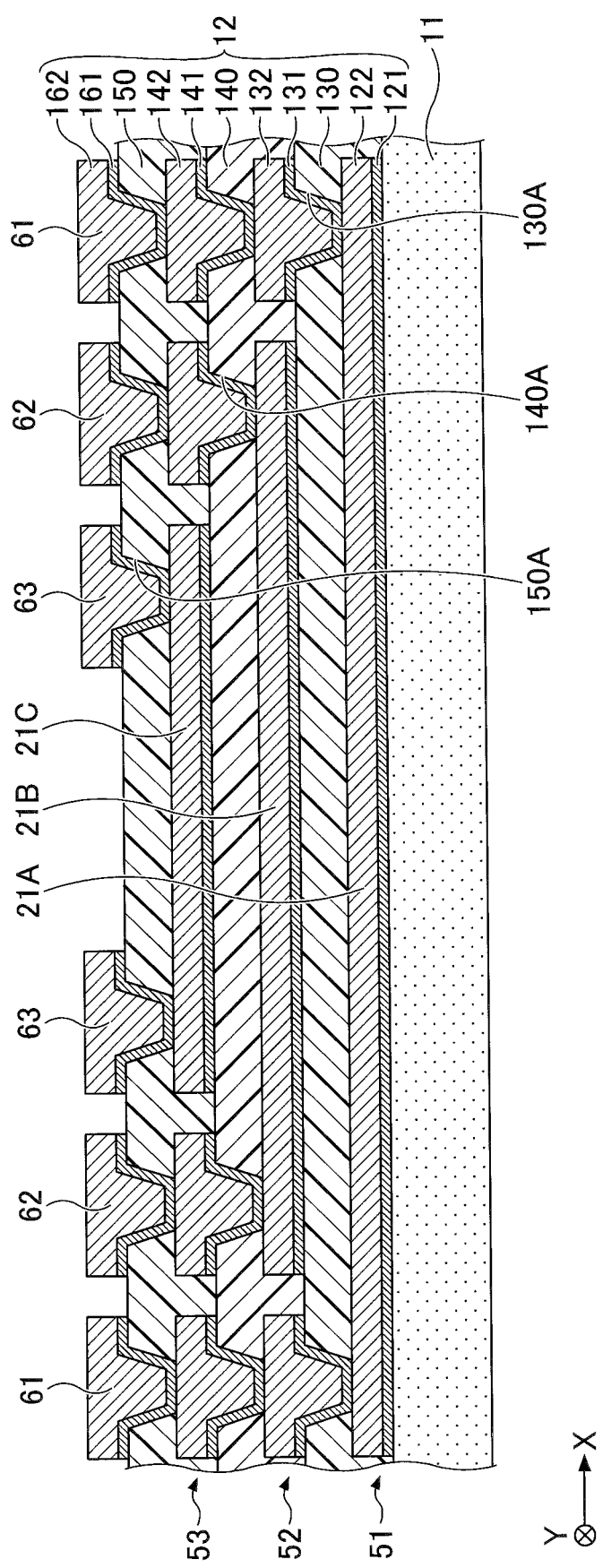
FIG. 5 is a cross sectional view illustrating the details of the thin-film layer.

Next, a cross sectional structure of the wiring board will be described. FIG. 3 is a cross sectional diagram schematically illustrating the wiring board according to the first embodiment. FIG. 4 and FIG. 5 are cross sectional views illustrating details of a thin-film layer. FIG. 4 corresponds to a cross sectional view along a line I-I in FIG. 2, and FIG. 5 corresponds to a cross sectional view along a line II-II in FIG. 1.

As illustrated in FIG. 3, the wiring board 1 includes a buildup substrate 11, and a thin-film layer 12 formed on one surface (that is, an upper surface in this example) of the buildup substrate 11. The micro-wirings 21 are formed in the thin-film layer 12. In the following description, the surface of the buildup substrate 11 formed with the thin-film layer 12 may be referred to as a mounting side, and a surface of the buildup substrate 11 opposite to the mounting side may be referred to as a non-mounting side.

As illustrated in FIG. 4, the thin-film layer 12 includes a first micro-wiring layer 51 formed on the buildup substrate 11, and a third insulating layer 130 covering the first micro-wiring layer 51. The first micro-wiring layer 51 includes a seed layer 121, and a metal plated layer 122. For example, the seed layer 121 includes a titanium layer, and a copper layer formed on the titanium layer, and the metal plated layer 122 is a copper plated layer. The first micro-wiring layer 51 includes micro-wirings 21A, the degassing holes 31A, and the anchor via pads 32A. The micro-wirings 21A are formed within the micro-wiring regions 4A through 4D, and the degassing holes 31A and the anchor via pads 32A are formed within the ground regions 7. The micro-wirings 21A are a part of the micro-wiring 21. In addition, micro-grooves 151 are formed in the surface of the buildup substrate 11, at a space part of the L/S pattern including the micro-wirings 21A. On the other hand, inside the degassing holes 31A, the surface of the buildup substrate 11 is located above bottom surfaces of the micro-grooves 151, and preferably matches an interface between the buildup substrate 11 and the micro-wirings 21A. The third insulating layer 130 is formed to fill the micro-grooves 151 and the degassing holes 31A. For example, the degassing holes 31A and the anchor via pads 32A respectively have a circular planar shape. The metal plated layer 122 is an example of a metal layer, the pattern within the micro-wiring regions 4A through 4D of the metal plated layer 122 is an example of a first pattern, and a pattern within the ground regions 7 of the metal plated layer 122 is an example of a second pattern. The micro-wirings 21A are examples of wirings, and the micro-grooves 151 are examples of grooves.

The thin-film layer 12 includes a second micro-wiring layer 52 formed on the third insulating layer 130, and a fourth insulating layer 140 covering the second micro-wiring layer 52. The second micro-wiring layer 52 includes a seed layer 131, and a metal plated layer 132. For example, the seed layer 131 includes a titanium layer, and a copper layer formed on the titanium layer, and the metal plated layer 132 is a copper plated layer. The second micro-wiring layer 52 includes micro-wirings 21B, the degassing holes 31B, and the anchor via pads 32B, as illustrated in FIG. 2. The micro-wirings 21B are formed within the micro-wiring regions 4A through 4D, and the degassing holes 31B and the anchor via pads 32B are formed within the ground regions 7. The micro-wirings 21B are a part of the micro-wiring 21. In addition, micro-grooves 152 are formed in the surface of the third insulating layer 130, at a space part of the L/S pattern including the micro-wirings 21B. On the other hand, inside the degassing holes 31B, the surface of the third insulating layer 130 is located above bottom surfaces of the micro-grooves 152, and preferably matches an interface between the third insulating layer 130 and the micro-wirings 21B. The fourth insulating layer 140 is formed to fill the micro-grooves 152 and the degassing holes 31B. For example, the degassing holes 31B and the anchor via pads 32B respectively have a circular planar shape. The metal plated layer 132 is an example of a metal layer, the pattern within the micro-wiring regions 4A through 4D of the metal plated layer 132 is an example of a first pattern, and a pattern within the ground regions 7 of the metal plated layer 132 is an example of a second pattern. The micro-wirings 21B are examples of wirings, and the micro-grooves 152 are examples of grooves.

The thin-film layer 12 includes a third micro-wiring layer 53 formed on the fourth insulating layer 140, and a fifth insulating layer 150 covering the third micro-wiring layer 53. The third micro-wiring layer 53 includes a seed layer 141, and a metal plated layer 142. For example, the seed layer 141 includes a titanium layer, and a copper layer formed on the titanium layer, and the metal plated layer 142 is a copper plated layer. The third micro-wiring layer 53 includes micro-wirings 21C, the degassing holes 31C, and the anchor via pads 32C. The micro-wirings 21C are formed within the micro-wiring regions 4A through 4D, and the degassing holes 31C and the anchor via pads 32C are formed within the ground regions 7. The micro-wirings 21C are a part of the micro-wiring 21. In addition, micro-grooves 153 are formed in the surface of the fourth insulating layer 140, at a space part of the L/S pattern including the micro-wirings 21C. On the other hand, inside the degassing holes 31C, the surface of the fourth insulating layer 140 is located above bottom surfaces of the micro-grooves 153, and preferably matches an interface between the fourth insulating layer 140 and the micro-wirings 21C. The fifth insulating layer 150 is formed to fill the micro-grooves 153 and the degassing holes 31C. For example, the degassing holes 31C and the anchor via pads 32C respectively have a circular planar shape. The metal plated layer 142 is an example of a metal layer, the pattern within the micro-wiring regions 4A through 4D of the metal plated layer 142 is an example of a first pattern, and a pattern within the ground regions 7 of the metal plated layer 142 is an example of a second pattern. The micro-wirings 21C are examples of wirings, and the micro-grooves 153 are examples of grooves.

Micro-via holes 140A are formed in the fourth insulating layer 140, and the anchor via pads 32C are joined, by metal-to-metal bonding, to the second micro-wiring layer 52 via the micro-via holes 140A. In addition, micro-via holes 130A are formed in the third insulating layer 130, as illustrated in FIG. 5, and the anchor via pads 32B are joined, by metal-to-metal bonding, to the first micro-wiring layer 51 via the micro-via holes 130A. Accordingly, the first micro-wiring layer 51, the second micro-wiring layer 52, and the third micro-wiring layer 53 are joined to one another, by metal-to-metal bonding, within the ground regions 7. Consequently, a strong bonding strength can be obtained by the anchor effect.

As illustrated in FIG. 5, the thin-film layer 12 includes connection terminals 61, 62, and 63 that connect to end parts of the micro-wiring 21 and project from the fifth insulating layer 150. The connection terminals 61 electrically connect to the micro-wirings 21A of the first micro-wiring layer 51, the connection terminals 62 electrically connect to the micro-wirings 21B of the second micro-wiring layer 52, and the connection terminals 63 electrically connect to the micro-wirings 21C of the third micro-wiring layer 53. The connection terminals 61 through 63 respectively include a seed layer 161 and a metal plated layer 162. For example, the seed layer 161 includes a titanium layer, and a copper layer formed on the titanium layer, and the metal plated layer 162 is a copper plated layer.

According to the wiring board 1, the micro-groove 151 is formed between the adjacent micro-wirings 21A, to reduce ion migration between the adjacent micro-wirings 21A. Similarly, the micro-groove 152 is formed between the adjacent micro-wirings 21B, to reduce ion migration between the adjacent micro-wirings 21B, and the micro-groove 153 is formed between the adjacent micro-wirings 21C, to reduce ion migration between the adjacent micro-wirings 21C.

Further, since no groove is formed inside each of the degassing holes 31A through 31C, voids are uneasily generated in the third insulating layer 130, the fourth insulating layer 140, and the fifth insulating layer 150. Hence, it is possible to reduce peeling (or separation) of the layer within the thin-film layer 12, and reduce the connection failure associated with the peeling.

Second Embodiment

Next, a second embodiment will be described. This second embodiment relates to a method of manufacturing the wiring board 1 according to the first embodiment. FIG. 6A through FIG. 26B are cross sectional views for explaining the method of manufacturing the wiring board according to the second embodiment. This second embodiment first forms the buildup substrate 11, and thereafter forms the thin-film layer 12 on the buildup substrate 11. FIG. 6A through FIG. 8 are cross sectional views illustrating a method of forming the buildup substrate. FIG. 9A through FIG. 26B are cross sectional views illustrating a method of forming the thin-film layer. FIG. 9A, FIG. 10A, FIG. 11A, . . . , and FIG. 26A illustrate a part corresponding to the cross sectional view along the line I-I in FIG. 2. FIG. 9B, FIG. 10B, FIG. 11B, . . . , and FIG. 26B illustrate a part corresponding to the cross sectional view along the line II-II in FIG. 1.

Figure 6A:
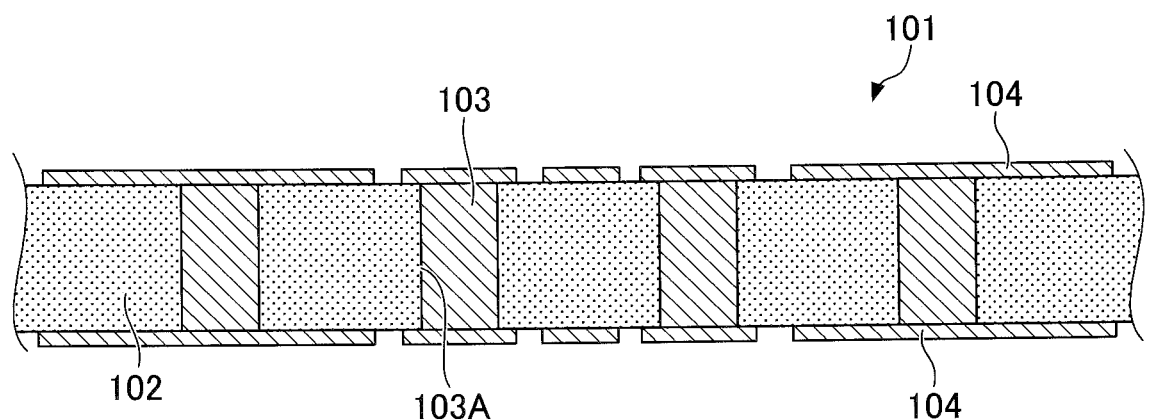
FIG. 6A and FIG. 6B are cross sectional views for explaining a method of manufacturing the wiring board according to a second embodiment.

First, as illustrated in FIG. 6A, a core wiring board 101 is prepared as a support body. The core wiring board 101 includes a core substrate 102, and a first wiring layer 104. The core substrate 102 includes through holes 103A that penetrate the core substrate 102 in a thickness direction of the core substrate 102. A through-conductor 103 is provided within the through hole 103A. For example, the through holes 103A may be formed by drilling, laser beam machining, or the like. For example, the through-conductor 103 and the first wiring layer 104 may be formed by plating, photolithography, or the like. A large board from which a plurality of wiring boards 1 can be made, may be used for the core wiring board 101. In other words, the core wiring board 101 may include a plurality of regions where structures each corresponding to the wiring board 1 are formed.

Figure 6B:
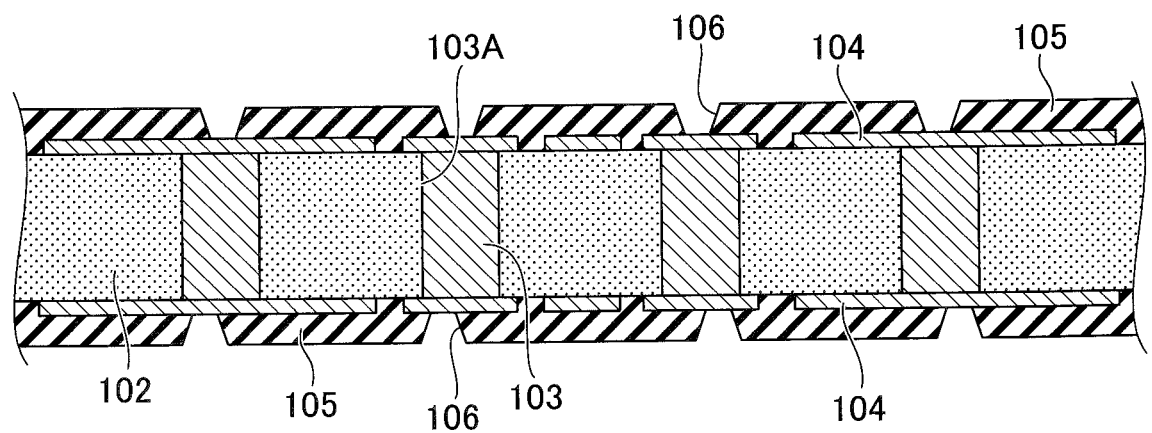

Next, as illustrated in FIG. 6B, an uncured resin film is adhered on both sides (that is, both upper and lower surfaces in this example) of the core substrate 102, and the uncured resin film is cured by performing a heat treatment, to form a first insulating layer 105. The first insulating layer 105 may be formed by an insulating resin, such as epoxy resins, polyimide resins, or the like. The first insulating layer 105 may be formed by coating a liquid resin. Thereafter, laser beam machining is performed on the first insulating layer 105 that is provided on both sides of the core substrate 102, to form, in the first insulating layer 105, via holes 106 respectively reaching a connection part of the first wiring layer 104.

Figure 7A:
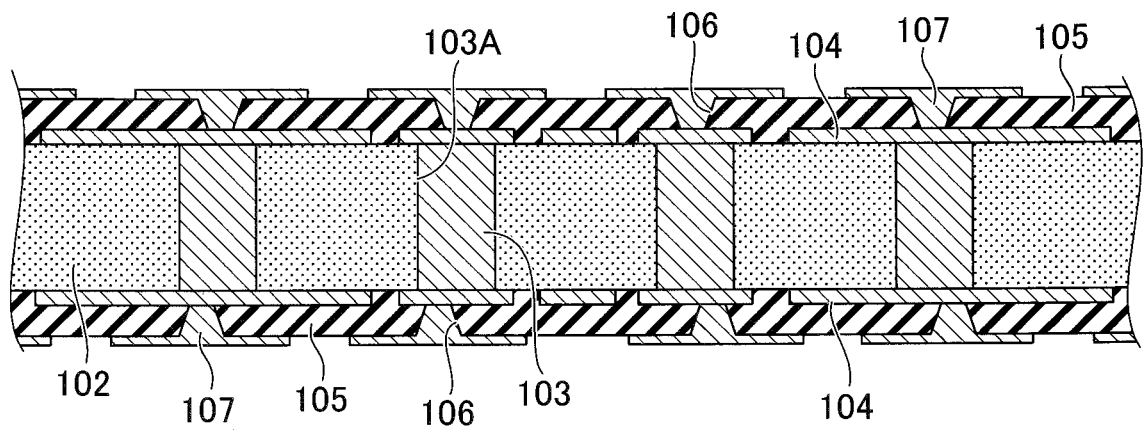
FIG. 7A and FIG. 7B are cross sectional views for explaining the method of manufacturing the wiring board according to the second embodiment.

Next, as illustrated in FIG. 7A, a second wiring layer 107, that electrically connects to the first wiring layer 104 through a via conductor within the via holes 106, is formed on the first insulating layer 105 that is provided on both sides of the core substrate 102. The second wiring layer 107 may be formed by a semi-additive method.

Figure 7B:
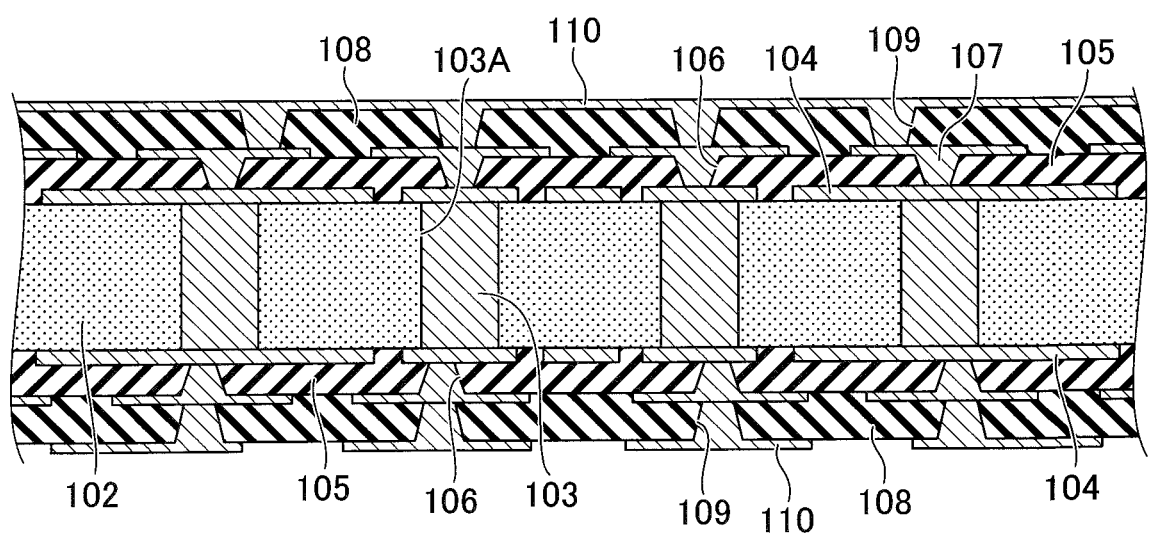

After forming the second wiring layer 107, a second insulating layer 108, including via holes 109 at a connection part of the second wiring layer 107, is formed on the first insulating layer 105 that is provided on both sides of the core substrate 102, as illustrated in FIG. 7B. The second insulating layer 108 may be formed by a method similar to that used to form the first insulating layer 105.

Further, as also illustrated in FIG. 7B, a third wiring layer 110, that electrically connects to the second wiring layer 107 through a via conductor within the via holes 109, is formed on the second insulating layer 108 that is provided on both sides of the core substrate 102. The third wiring layer 110 may be formed by a semi-additive method similar to that used to form the second wiring layer 107. However, on the mounting side of the core substrate 102, the third wiring layer 110 may be formed as a solid layer (or continuous layer), without forming the wiring pattern of the third wiring layer 110 on the second insulating layer 108.

Figure 8:
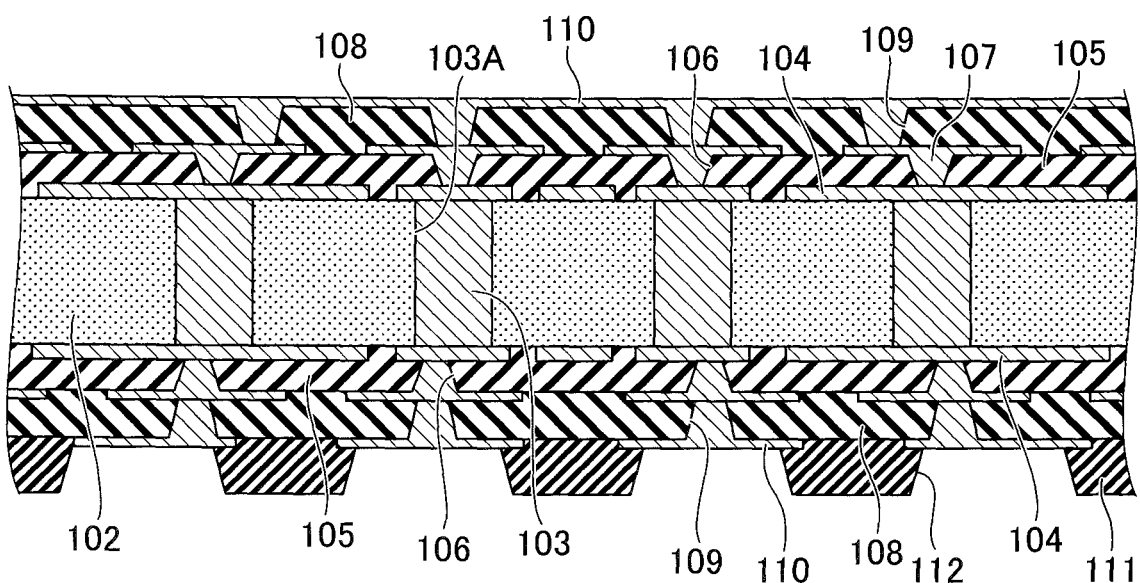
FIG. 8 is a cross sectional view for explaining the method of manufacturing the wiring board according to the second embodiment.

Next, as illustrated in FIG. 8, on the non-mounting side of the core substrate 102, a solder resist layer 111 is formed on the second insulating layer 108. Thereafter, openings 112 respectively reaching a connection part of the third wiring layer 110 are formed in the solder resist layer 111.

The solder resist layer 111 may be formed by an insulating resin, such as photosensitive epoxy resins, photosensitive acrylic resins, or the like. The solder resist layer 111 may be formed by adhering a resin film, or by coating a liquid resin. The openings 112 may be formed by exposing and developing the solder resist layer 111. An insulating resin, such as non-photosensitive epoxy resins, non-photosensitive acrylic resins, or the like may be used for the solder resist layer 111. In this case, the opening 112 may be formed by performing laser beam machining or blasting with respect to the non-photosensitive resin.

The buildup substrate 11 can be formed by the processes described heretofore.

Next, as illustrated in FIG. 9A and FIG. 9B, the surface on the mounting side of the buildup substrate 11 is polished by chemical mechanical polishing, to expose the second insulating layer 108.

Thereafter, as illustrated in FIG. 10A and FIG. 10B, a seed layer 121 is formed on the second insulating layer 108 and the third wiring layer 110 within the via holes 109. For example, the seed layer 121 may be famed by successively forming a titanium layer and a copper layer by sputtering.

Next, as illustrated in FIG. 11A and FIG. 11B, a plated resist layer 191, including an opening at a part where the first micro-wiring layer 51 is formed, is formed on the seed layer 121. For example, the plated resist layer 191 includes openings at parts where the micro-wirings 21A are formed and at parts where the anchor via pads 32A are formed, and covers parts where the degassing holes 31A are formed.

Next, as illustrated in FIG. 12A and FIG. 12B, the metal plated layer 122 made of copper or the like is formed in the openings of the plated resist layer 191, by electroplating using the seed layer 121 as a plating power feeding path.

Thereafter, as illustrated in FIG. 13A and FIG. 13B, the plated resist layer 191 is removed.

Next, as illustrated in FIG. 14A and FIG. 14B, the seed layer 121 is removed by wet etching, using the metal plated layer 122 as a mask. The micro-wirings 21A, the degassing holes 31A, and the anchor via pads 32A are formed in the first micro-wiring layer 51. Hence, the first micro-wiring layer 51 may be formed by a semi-additive method.

Figure 15A:
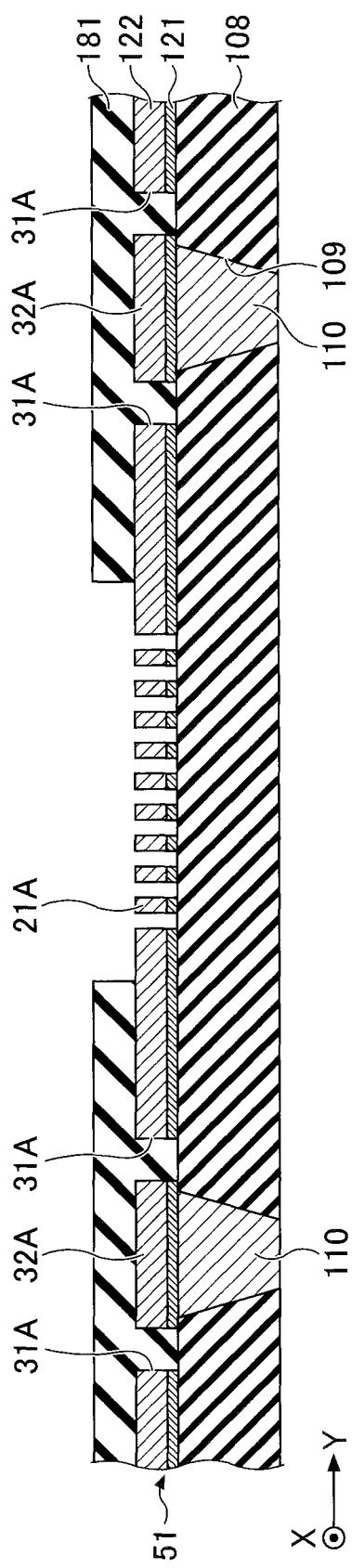
FIG. 15A and FIG. 15B are cross sectional views for explaining the method of manufacturing the wiring board according to the second embodiment.
Figure 15B:
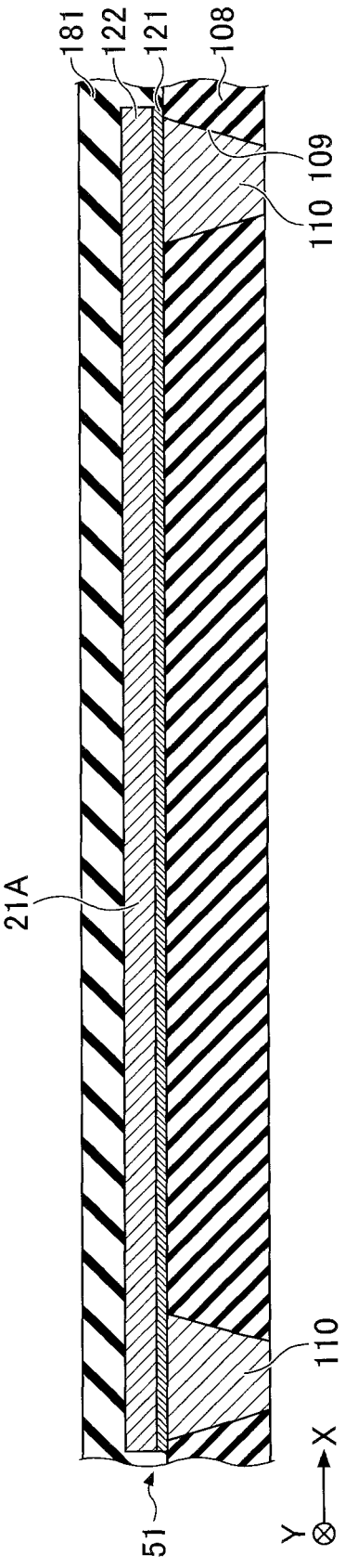

Next, as illustrated in FIG. 15A and FIG. 15B, a protection layer 181, including openings at space parts of the L/S pattern of the first micro-wiring layer 51 that includes the micro-wirings 21A, is formed. For example, the protection layer 181 may be formed by an insulating resin such as photosensitive epoxy resins or the like.

Thereafter, as illustrated in FIG. 16A and FIG. 16B, the protection layer 181, and parts of the second insulating layer 108 exposed from the protection layer 181, are etched. As a result, the micro-grooves 151 are formed in the second insulating layer 108 at the space parts of the L/S pattern that includes the micro-wirings 21A. On the other hand, due to the coverage provided by the protection layer 181, no groove is formed in parts of the second insulating layer 108 exposed through the degassing holes 31A.

Next, as illustrated in FIG. 17A and FIG. 17B, the third insulating layer 130, including the micro-via holes 130A above parts of the first micro-wiring layer 51, is formed on the first micro-wiring layer 51 and the second insulating layer 108. For example, the third insulating layer 130 may be formed by an insulating resin, such as photosensitive epoxy resins or the like. The micro-via holes 130A may be formed by photolithography, for example.

Next, as illustrated in FIG. 18A and FIG. 18B, the second micro-wiring layer 52, that electrically connects to the first micro-wiring layer 51 through the via conductor within the micro-via holes 130A, is formed on the third insulating layer 130. The second micro-wiring layer 52 may be formed by a semi-additive method similar to that used to form the first micro-wiring layer 51, and includes the seed layer 131 and the metal plated layer 132. The micro-wirings 21B, the degassing holes 31B, and the anchor via pads 32B illustrated in FIG. 2 are formed in the second micro-wiring layer 52.

Thereafter, as illustrated in FIG. 19A and FIG. 19B, a protection layer 182, including openings at space parts of the L/S pattern of the second micro-wiring layer 52 that includes the micro-wirings 21B, is formed. For example, the protection layer 182 may be formed by an insulating resin such as photosensitive epoxy resins or the like.

Next, as illustrated in FIG. 20A and FIG. 20B, the protection layer 182, and parts of the third insulating layer 130 exposed from the protection layer 182, are etched. As a result, the micro-grooves 152 are formed in the third insulating layer 130 at the space parts of the L/S pattern that includes the micro-wirings 21B. On the other hand, due to the coverage provided by the protection layer 182, no groove is formed in parts of the third insulating layer 130 exposed through the degassing holes 31B.

Next, as illustrated in FIG. 21A and FIG. 21B, the fourth insulating layer 140, including the micro-via holes 140A above parts of the second micro-wiring layer 52, is formed on the second micro-wiring layer 52 and the third insulating layer 130. For example, the fourth insulating layer 140 may be formed by an insulating resin, such as photosensitive epoxy resins or the like. The micro-via holes 140A may be formed by photolithography, for example.

Figure 22A:
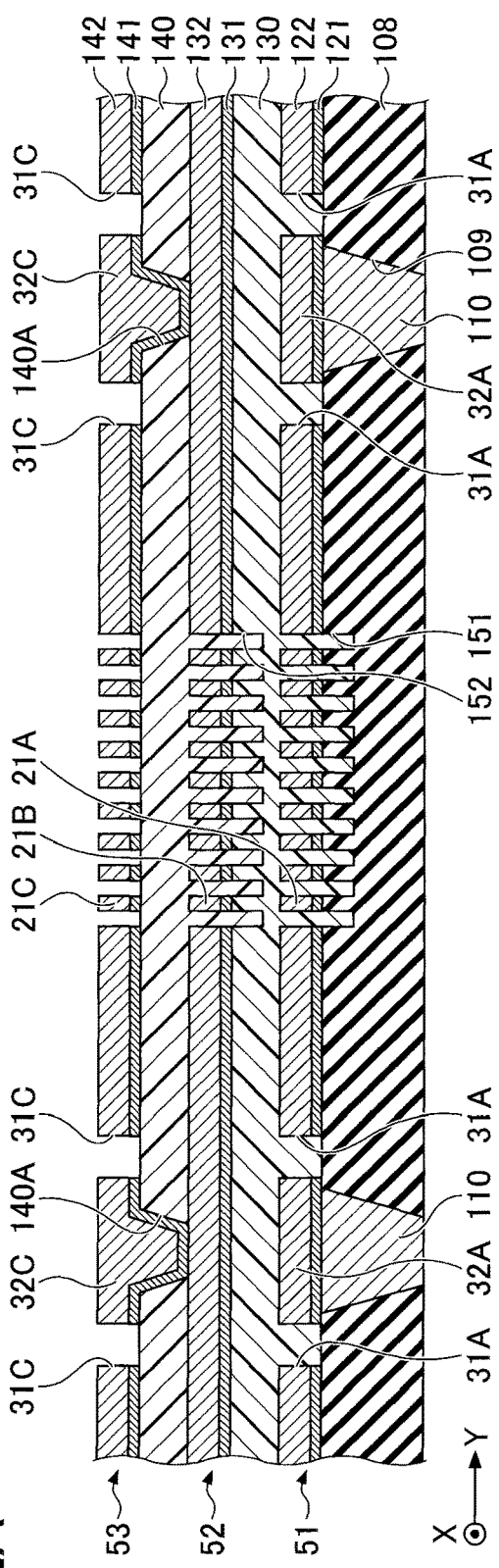
FIG. 22A and FIG. 22B are cross sectional views for explaining the method of manufacturing the wiring board according to the second embodiment.
Figure 22B:
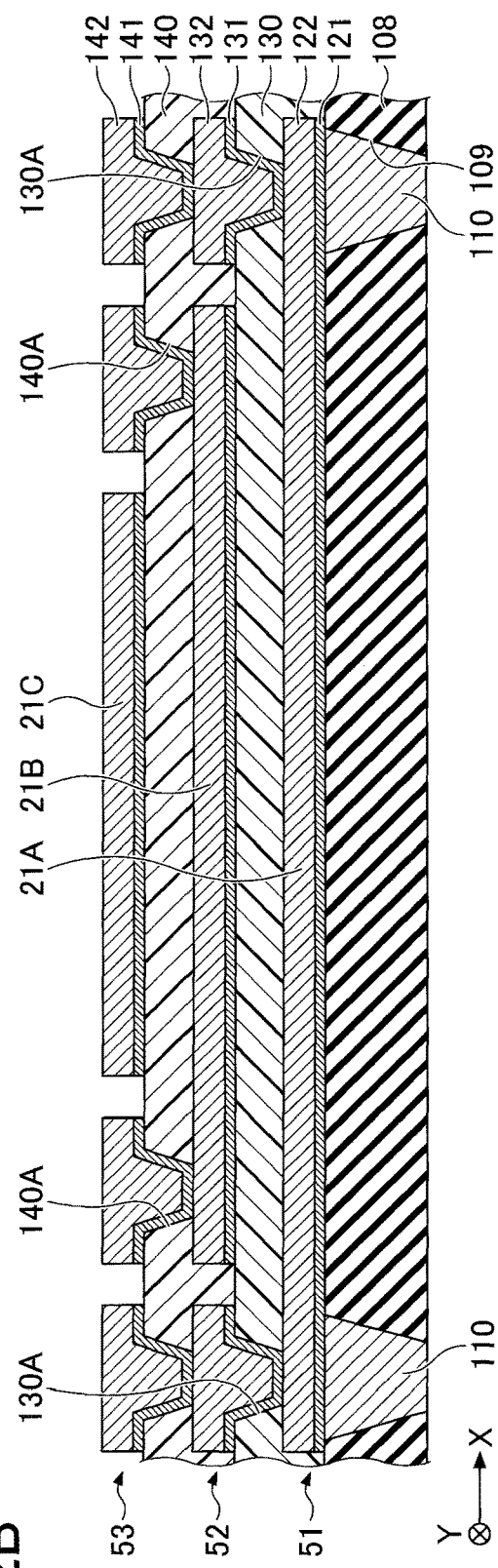

Thereafter, as illustrated in FIG. 22A and FIG. 22B, the third micro-wiring layer 53, that electrically connects to the second micro-wiring layer 52 through the via conductor within the micro-via holes 140A, is formed on the fourth insulating layer 140. The third micro-wiring layer 53 may be formed by a semi-additive method similar to that used to form the first micro-wiring layer 51, and includes the seed layer 141 and the metal plated layer 142. The micro-wirings 21C, the degassing holes 31C, and the anchor via pads 32C are formed in the third micro-wiring layer 53.

Next, as illustrated in FIG. 23A and FIG. 23B, a protection layer 183, including openings at space parts of the L/S pattern of the third micro-wiring layer 53 that includes the micro-wirings 21C, is formed. For example, the protection layer 183 may be formed by an insulating resin such as photosensitive epoxy resins or the like.

Figure 24A:
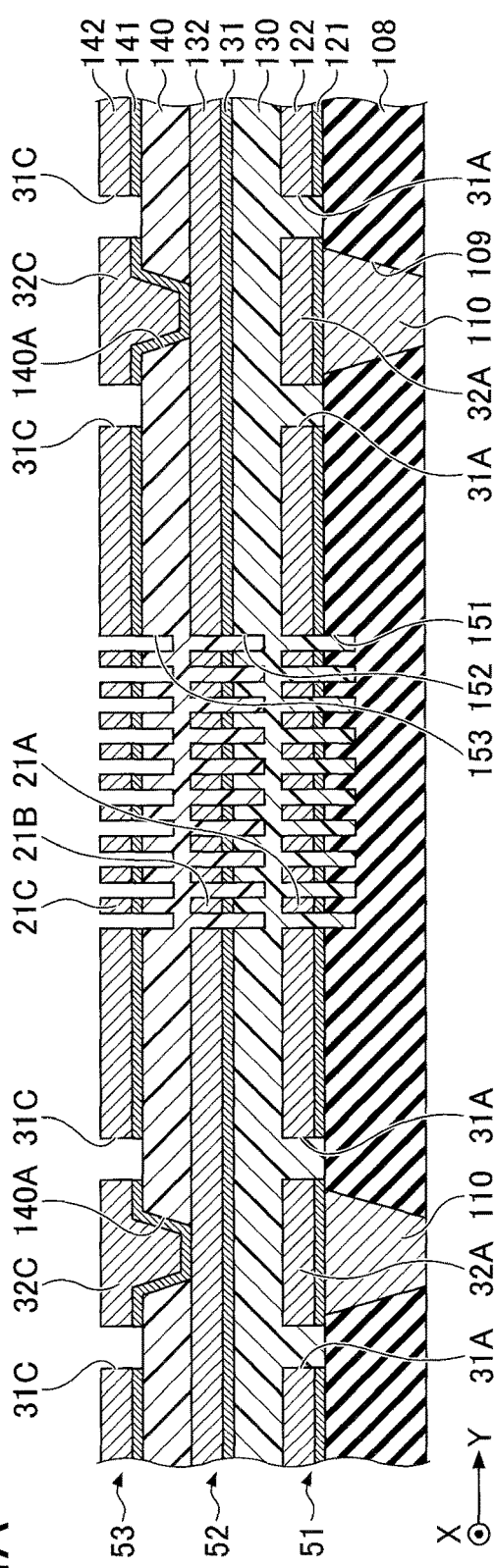
FIG. 24A and FIG. 24B are cross sectional views for explaining the method of manufacturing the wiring board according to the second embodiment.
Figure 24B:
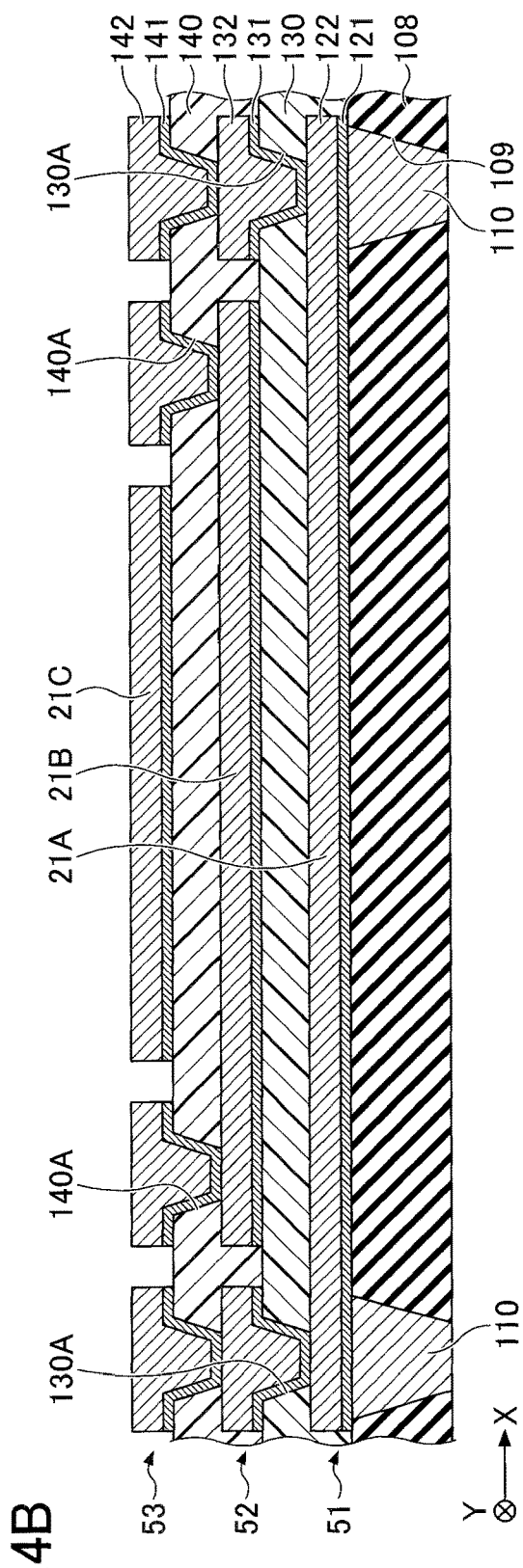

Next, as illustrated in FIG. 24A and FIG. 24B, the protection layer 183, and parts of the fourth insulating layer 140 exposed from the protection layer 183, are etched. As a result, the micro-grooves 153 are formed in the fourth insulating layer 140 at the space parts of the L/S pattern that includes the micro-wirings 21C. On the other hand, due to the coverage provided by the protection layer 183, no groove is formed in parts of the fourth insulating layer 140 exposed through the degassing holes 31C.

Figure 25A:
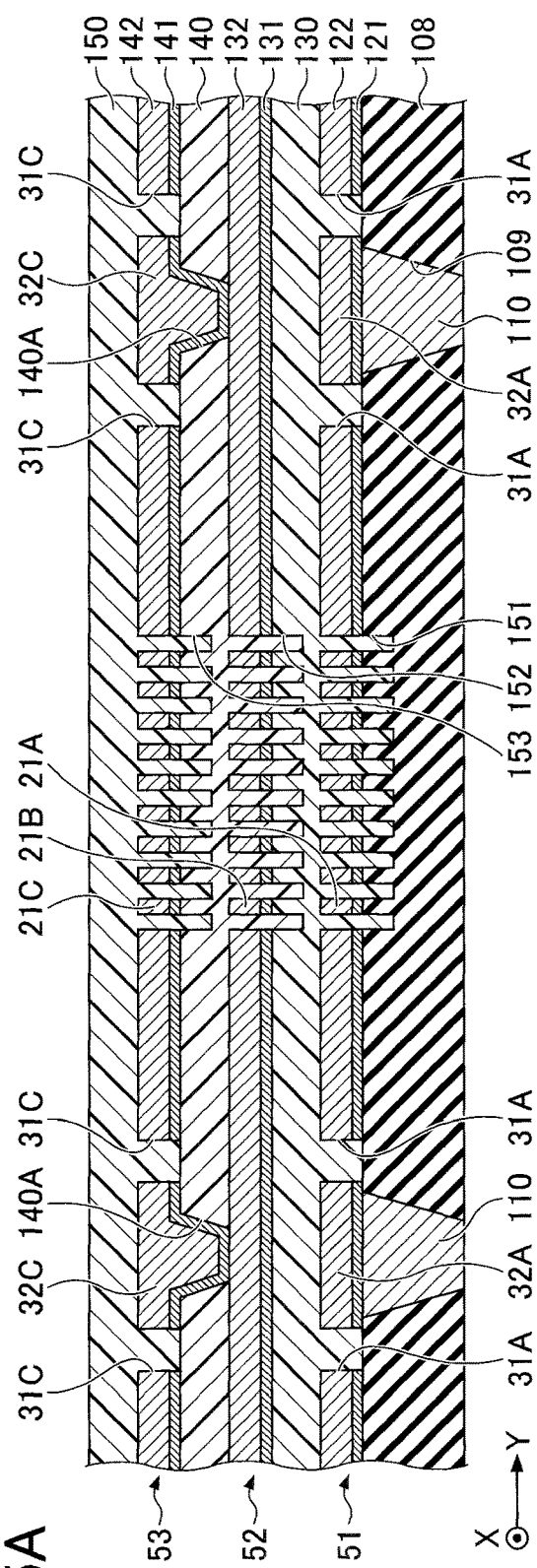
FIG. 25A and FIG. 25B are cross sectional views for explaining the method of manufacturing the wiring board according to the second embodiment.
Figure 25B:
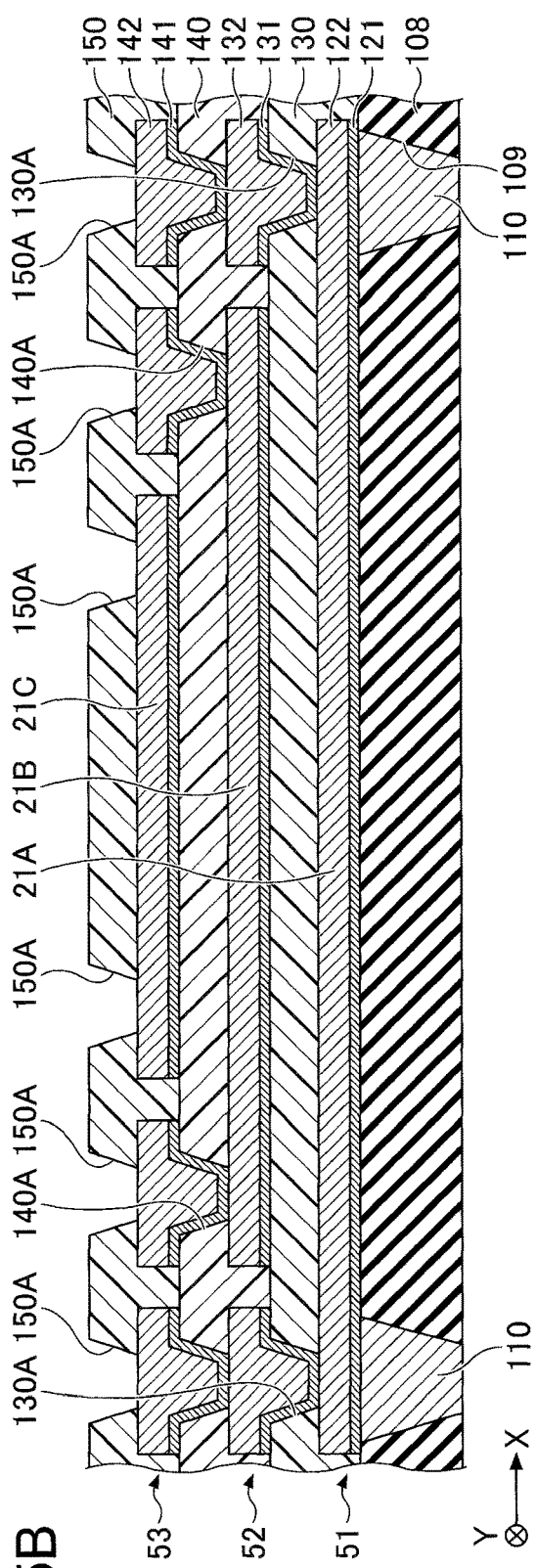

Thereafter, as illustrated in FIG. 25A and FIG. 25B, the fifth insulating layer 150, including the micro-via holes 150A above parts of the third micro-wiring layer 53, is formed on the third micro-wiring layer 53 and the fourth insulating layer 140. For example, the fifth insulating layer 150 may be formed by an insulating resin, such as photosensitive epoxy resins or the like. The micro-via holes 150A may be formed by photolithography, for example.

Next, as illustrated in FIG. 26A and FIG. 26B, the connection terminals 61 through 63, that electrically connect to the third micro-wiring layer 53 through the via conductor within the micro-via holes 150A, are formed on the fifth insulating layer 150. The connection terminals 61 through 63 may be formed by a semi-additive method similar to that used to form the first micro-wiring layer 51, and respectively include the seed layer 161 and the metal plated layer 162.

Next, the structure illustrated in FIG. 26A and FIG. 26B is cut along cutting lines (not illustrated) using a slicer or the like. Hence, the structure is cut into a plurality of pieces respectively corresponding to the wiring board 1, and a plurality of wiring boards 1 according to the first embodiment are obtained from the large core wiring board 101. The wiring board 1 according to the first embodiment can be manufactured by the processes described heretofore.

According to this manufacturing method, no groove is famed inside the degassing holes 31A, because the micro-grooves 151 are formed in a state where the degassing holes 31A are covered by the protection layer 181. For this reason, the micro-grooves 151 and the degassing holes 31A can be appropriately filled with the third insulating layer 130, to prevent the generation of voids. In addition, no groove is formed inside the degassing holes 31B, because the micro-grooves 152 are formed in a state where the degassing holes 31B are covered by the protection layer 182. For this reason, the micro-grooves 152 and the degassing holes 31B can be appropriately filled with the fourth insulating layer 140, to prevent the generation of voids. Further, no groove is formed inside the degassing holes 31C, because the micro-grooves 153 are formed in a state where the degassing holes 31C are covered by the protection layer 183. For this reason, the micro-grooves 153 and the degassing holes 31C can be appropriately filled with the fifth insulating layer 150, to prevent the generation of voids. Accordingly, it is possible to reduce the peeling of the layer caused by the void, and reduce the connection failure associated with the peeling.

Third Embodiment

Next, a third embodiment will be described. This third embodiment relates to another method of manufacturing the wiring board 1 according to the first embodiment. In the following, features of this third embodiment that differ from those of the second embodiment will be described. FIG. 27A through FIG. 30B are cross sectional views for explaining the method of manufacturing the wiring board according to the third embodiment.

In this third embodiment, as illustrated in FIG. 27A and FIG. 27B, the processes up to removal of the plated resist layer 191 are performed, similar to the second embodiment. Next, the protection layer 181 is formed without removing the seed layer 121.

Next, as illustrated in FIG. 28A and FIG. 28B, the seed layer 121 is removed by wet etching, using the metal plated layer 122 exposed from the protection layer 181 as a mask.

Thereafter, as illustrated in FIG. 29A and FIG. 29B, the protection layer 181, and parts of the second insulating layer 108 exposed from the protection layer 181, are etched. As a result, the micro-grooves 151 are formed in the second insulating layer 108 at the space parts of the L/S pattern that includes the micro-wirings 21A. On the other hand, due to the coverage provided by the protection layer 181, and because the seed layer 121 remains, no groove is formed in parts of the second insulating layer 108 inside the degassing holes 31A.

Next, as illustrated in FIG. 30A, the seed layer 121 is removed by wet etching, using the metal plated layer 122 as a mask. The micro-wirings 21A, the degassing holes 31A, and the anchor via pads 32A are formed in the first micro-wiring layer 51. The cross section illustrated in FIG. 30B remains unchanged from the cross section illustrated in FIG. 29B.

According to the third embodiment, the micro-grooves 151 are formed in a state where the seed layer 121 remains inside the degassing holes 31A. Hence, it is possible to more positively prevent a groove from being formed in the second insulating layer 108 inside the degassing holes 31A.

Thereafter, the second micro-wiring layer 52 and the third micro-wiring layer 53 are formed by repeating similar processes. In other words, the micro-grooves 152 are formed in a state where the seed layer 131 remains inside the degassing holes 31B, and the micro-grooves 153 are formed in a state where the seed layer 141 remains inside the degassing holes 31C.

Next, the fifth insulating layer 150, the connection terminals 61 through 63, or the like are formed, and the cutting is performed using the slicer or the like. As a result, the structure is cut into a plurality of pieces respectively corresponding to the wiring board 1, and a plurality of wiring boards 1 according to the first embodiment are obtained from the large core wiring board 101. The wiring board 1 according to the first embodiment can be manufactured by the processes described heretofore.

According to the third embodiment, it is also possible to reduce the peeling of the layer caused by the void, and reduce the connection failure associated with the peeling.

Therefore, according to each of the embodiments described above, it is possible to reduce the connection failure.

Although examples of preferable embodiments are described heretofore, the present invention is not limited to these embodiments, and various variations, modifications, and substitutions may be made without departing from the scope of the present invention. For example, although the described embodiments use the buildup substrate, it is of course possible to use a support substrate or a support base in place of the buildup substrate.

Various aspects of the subject-matter described herein may be set out non-exhaustively in the following numbered clauses:

1. A method of manufacturing a wiring board, comprising:
forming a metal layer on an insulating layer;
forming, in the metal layer, a first pattern that includes a plurality of wirings extending parallel to each other, and a second pattern that includes a degassing hole; and
forming a groove in the insulating layer, by etching the insulating layer exposed between the plurality of wirings, in a state where the second pattern is covered by a protection layer.

2. The method of manufacturing the wiring board according to clause 1, further comprising:
forming a seed layer on the insulating layer, before the forming the metal layer; and
forming a degassing hole in the seed layer, before the forming the groove.

3. The method of manufacturing the wiring board according to clause 1, further comprising:
forming a seed layer on the insulating layer, before the forming the metal layer; and
forming a degassing hole in the seed layer, after the forming the groove.

4. The method of manufacturing the wiring board according to any one of clauses 1 to 3, wherein the plurality of wirings are formed by a line-and-space pattern.

5. The method of manufacturing the wiring board according to any one of clauses 1 to 4, wherein the degassing hole has a circular planar shape.

6. The method of manufacturing the wiring board according to any one of clauses 1 to 5, wherein the forming the first pattern and the second pattern includes forming a pad in the metal layer inside the degassing hole.

7. The method of manufacturing the wiring board according to clause 4, wherein the forming the groove forms the groove in the insulating layer, at a space part of the line-and-space pattern.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
an insulating layer having a lower surface, and an upper surface opposite to the lower surface; and
a metal layer, formed on the upper surface of the insulating layer, and including
a first pattern that includes a plurality of wirings extending parallel to each other, and
a second pattern that includes a degassing hole exposing the insulating layer,
wherein the insulating layer includes a groove, separate from the degassing hole, and formed between the plurality of wirings, and
wherein a first surface of the insulating layer exposed inside the degassing hole has a first height position, and a second surface of the insulating layer forming a bottom surface of the groove has a second height position, and the first height position is higher than the second height position relative to the lower surface of the insulating layer along a thickness direction of the insulating layer.

2. The wiring board as claimed in claim 1, wherein the first surface of the insulating layer, exposed inside the degassing hole, matches an interface between the insulating layer and plurality of wirings.

3. The wiring board as claimed in claim 2, wherein the plurality of wirings are formed in a line-and-space pattern.

4. The wiring board as claimed in claim 1, wherein the plurality of wirings are formed in a line-and-space pattern.

5. The wiring board as claimed in claim 4, wherein groove is formed in the insulating layer, at a space part of the line-and-space pattern.

6. The wiring board as claimed in claim 1, wherein the degassing hole has a circular shape in a plan view.

7. The wiring board as claimed in claim 1, further comprising:
a metal pad provided on the first surface of the insulating layer exposed inside the degassing hole.

8. The wiring board as claimed in claim 7, wherein the metal pad has an island shape separated from a sidewall of the metal layer forming, the degassing hole in the second pattern.

9. The wiring board, as claimed in claim 1, wherein
the insulating layer and the metal layer form a pair,
a plurality of pairs are laminated along the thickness direction, so that each of the plurality of pairs includes a plurality of degassing holes,
the plurality of degassing holes of a first pair, and the plurality of degassing holes of a second pair adjacent to the first pair along the thickness direction, are non-aligned and separated from each other in a plan view, and
the plurality of degassing holes of the first pair, and the plurality of degassing holes of a third pair non-adjacent to the first pair along the thickness direction, are aligned and overlap each other in the plan view.

10. The wiring board as claimed in claim 9, wherein the second pair is laminated on the first pair, and the third pair is laminated on the second pair.

11. The wiring board as claimed in claim 9, wherein the groove in the insulating layer of the first pair, the groove in the insulating layer of the second pair, and the groove in the insulating layer, of the third pair, are aligned and overlap each other in the plan view.

12. The wiring board as claimed in claim 9, wherein each of the plurality of pairs includes a metal seed layer, interposed between the insulating layer and the metal layer thereof, and penetrated by the plurality of degassing boles thereof.

13. The wiring board as claimed in claim 1, wherein the groove, in a plan view, is arranged between a first region provided with the first pattern, and a second region provided with the degassing hole.

14. The wiring, board as claimed in claim 1, further comprising:
a metal seed layer, interposed between the insulating layer and the metal layer, and penetrated by the degassing hole.

15. The wiring board as claimed in claim 14, wherein no groove is formed inside the degassing hole, in parts of the insulating layer exposed through the degassing hole.

* * * * *